US012765150B2

(12) United States Patent
Feng et al.

(10) Patent No.: US 12,765,150 B2
(45) Date of Patent: Oct. 13, 2026

(54) DISPLAY PANEL AND MANUFACTURING METHOD THEREOF, DISPLAY DEVICE AND SPLICING DISPLAY DEVICE

(71) Applicants: BOE MLED Technology Co., Ltd., Beijing (CN); BOE TECHNOLOGY GROUP CO., LTD., Beijing (CN)

(72) Inventors: Sha Feng, Beijing (CN); Ting Cai, Beijing (CN); Chao Liu, Beijing (CN); Lili Wang, Beijing (CN); Jing Wang, Beijing (CN); Mingming Jia, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 813 days.

(21) Appl. No.: 18/017,337

(22) PCT Filed: Jan. 28, 2022

(86) PCT No.: PCT/CN2022/074826
§ 371 (c)(1),
(2) Date: Jan. 20, 2023

(87) PCT Pub. No.: WO2023/142003
PCT Pub. Date: Aug. 3, 2023

(65) Prior Publication Data

US 2024/0258477 A1 Aug. 1, 2024

(51) Int. Cl.

| | |
|---|---|
| ***H10H 29/49*** | (2025.01) |
| ***H10H 20/857*** | (2025.01) |
| ***H10H 29/14*** | (2025.01) |
| ***H10H 29/39*** | (2025.01) |
| ***H10W 90/00*** | (2026.01) |
| *H10H 20/01* | (2025.01) |

(52) U.S. Cl.
CPC .......... *H10H 29/49* (2025.01); *H10H 20/857* (2025.01); *H10H 29/142* (2025.01);
(Continued)

(58) Field of Classification Search
None
See application file for complete search history.

(56) References Cited

U.S. PATENT DOCUMENTS

2013/0242242 A1 9/2013 Saida
2017/0133411 A1 5/2017 Xie et al.
(Continued)

FOREIGN PATENT DOCUMENTS

CN 104821294 A 8/2015
CN 105867689 A 8/2016
(Continued)

OTHER PUBLICATIONS

International Search Report and Written Opinion on the International Application No. PCT/CN2021/095872 issued by the International Searching Authority on Feb. 15, 2022.

*Primary Examiner* — Feifei Yeung Lopez
(74) *Attorney, Agent, or Firm* — XSENSUS LLP

(57) ABSTRACT

A display panel includes a backplane including a first surface, a second surface and at least one side surface, at least one connection lead disposed on the backplane, and a first protective layer. The connection lead extends from the first surface to the second surface via a side surface in the at least one side surface. The connection lead includes a first lead segment located on the first surface, a second lead segment located on the second surface, and a third lead segment located on the side surface and connecting the first lead segment and the second lead segment. The first protective layer covers at least the first lead segment and the third lead segment. At least one opening is disposed in the
(Continued)

first protective layer, and at least a portion of the second lead segment is exposed by an opening in the at least one opening.

20 Claims, 21 Drawing Sheets

(52) U.S. Cl.
CPC ............ *H10H 29/39* (2025.01); *H10W 90/00* (2026.01); *H10H 20/0364* (2025.01)

(56) References Cited

U.S. PATENT DOCUMENTS

| | | | | |
|---|---|---|---|---|
| 2018/0175080 | A1 | 6/2018 | Shi | |
| 2020/0259056 | A1* | 8/2020 | Hong | H01L 25/167 |
| 2021/0135171 | A1 | 5/2021 | Sun et al. | |
| 2021/0159219 | A1 | 5/2021 | Wang et al. | |
| 2021/0396989 | A1 | 12/2021 | Wynne | |
| 2023/0050951 | A1* | 2/2023 | Wu | H01L 23/5387 |

FOREIGN PATENT DOCUMENTS

| | | | |
|---|---|---|---|
| CN | 109599427 | A | 4/2019 |
| CN | 110503898 | A | 11/2019 |
| CN | 110993775 | A | 4/2020 |
| CN | 212256800 | U | 12/2020 |
| CN | 113270457 | A | 8/2021 |
| CN | 113348561 | A | 9/2021 |
| CN | 113547205 | A | 10/2021 |
| CN | 113690269 | A | 11/2021 |
| CN | 113793859 | A | 12/2021 |

* cited by examiner

DISPLAY PANEL AND MANUFACTURING METHOD THEREOF, DISPLAY DEVICE AND SPLICING DISPLAY DEVICE

CROSS-REFERENCE TO RELATED APPLICATION

This application is a national phase entry under 35 USC 371 of International Patent Application No. PCT/CN 2022/074826 filed on Jan. 28, 2022, which is incorporated herein by reference in its entirety.

TECHNICAL FIELD

The present disclosure relates to the field of display technologies, and in particular, to a display panel and a manufacturing method thereof, a display device and a splicing display device.

BACKGROUND

Mini light-emitting diode (Mini LED) display devices and micro light-emitting diode (Micro LED) display devices have self-luminous display characteristics, and have advantages including all solid state, long life, high brightness, low power consumption, small volume, and ultrahigh resolution.

Due to a high difficulty of a mass transfer process for a Mini LED chip in a Mini LED display device and a Micro LED chip in a Micro LED display device, there is a high difficulty of directly manufacturing a large-size display device. Therefore, a large-size display panel is usually manufactured by splicing a plurality of small-size Mini LED display devices or a plurality of small-size Micro LED display devices.

SUMMARY

In an aspect, a display panel is provided. The display panel includes a backplane, at least one connection lead and a first protective layer. The backplane includes a first surface and a second surface opposite to each other, and at least one side surface connecting the first surface and the second surface. The connection lead is disposed on the backplane, and extends from the first surface to the second surface via a side surface in the at least one side surface. The connection lead includes a first lead segment located on the first surface, a second lead segment located on the second surface and a third lead segment connecting the first lead segment and the second lead segment, and the third lead segment is located on the side surface. The first protective layer covers at least the first lead segment and the third lead segment. At least one opening is disposed in the first protective layer, and at least a portion of the second lead segment is exposed by an opening in the at least one opening. The at least a portion of the second lead segment exposed by the opening is configured to be connected to a circuit board.

In some embodiments, an orthogonal projection of the opening on the second surface is located within an orthographic projection of the second lead segment on the second surface, and in a first direction, each of two borders of the opening and a respective one of two borders of a portion of the second lead segment corresponding to the opening have a distance therebetween. The first direction is parallel to a boundary line of the side surface and the second surface.

In some embodiments, the at least one connection lead includes a plurality of connection leads, and second lead segments of at least two connection leads located at a same side surface are arranged at intervals in a first direction. The first direction is parallel to a boundary line of the same side surface and the second surface. The at least one opening includes a plurality of openings, and at least two openings located at the same side surface are arranged at intervals in the first direction. An opening in the at least two openings exposes at least a portion of a second lead segment of a connection lead in the at least two connection leads.

In some embodiments, the first protective layer further covers a portion of the second lead segment close to the third lead segment.

In some embodiments, the second lead segment includes a first sub-segment, a second sub-segment and a third sub-segment connected in sequence. The first sub-segment is connected to the third lead segment. An extending direction of the second sub-segment and an extending direction of the first sub-segment intersect, and an extending direction of the third sub-segment is substantially same as the extending direction of the first sub-segment. The first protective layer further covers the first sub-segment and the second sub-segment, and the third sub-segment is exposed by the opening.

In some embodiments, the at least one connection lead includes a plurality of connection leads, and in a direction from the first sub-segment to the third sub-segment, second sub-segments of at least two connection leads located at a same side surface get closer.

In some embodiments, the second lead segment includes a fourth sub-segment and a fifth sub-segment connected in sequence. The fourth sub-segment is connected to the third lead segment, and the fourth sub-segment and the fifth sub-segment are located on a same straight line. The first protective layer further covers the fourth sub-segment, and the fifth sub-segment is exposed by the opening.

In some embodiments, the backplane has a display area and a non-display area located on at least one side of the display area. The first lead segment is located in the non-display area, and the first protective layer further covers regions respectively located at two sides of the connection lead in a first direction. The first direction is parallel to a boundary line of the side surface and the second surface. The display area is non-covered by the first protective layer.

In some embodiments, the display panel further includes a second protective layer located on a side of the first protective layer away from the connection lead. An orthographic projection of the second protective layer on the second surface is non-overlapped with at least one orthogonal projection of the at least one opening on the second surface.

In some embodiments, the second protective layer has a border located on the second surface, and the opening is located on a side of the border away from the side surface.

In some embodiments, the display panel further includes the circuit board. The circuit board is located on a side of the backplane where the second surface is located, and is connected to the second lead segment through the opening.

In some embodiments, the display panel further includes a third protective layer disposed on the second surface of the backplane. The third protective layer covers a portion of the first protective layer located on the second surface and a portion of the circuit board connected to the second lead segment.

In some embodiments, the display panel further includes a pad located on the first surface. The pad is electrically connected to the first lead segment of the connection lead, and the first protective layer further covers the pad.

In some embodiments, a material of the first protective layer includes silicon nitride.

In another aspect, a manufacturing method of a display panel is provided. The manufacturing method of the display panel includes following steps.

A backplane is provided. The backplane includes a first surface and a second surface opposite to each other, and at least one side surface connecting the first surface and the second surface.

At least one connection lead is formed on the backplane. The connection lead extends from the first surface to the second surface via a side surface in the at least one side surface. The connection lead includes a first lead segment located on the first surface, a second lead segment located on the second surface and a third lead segment connecting the first lead segment and the second lead segment, and the third lead segment is located on the side surface.

A first protective layer is formed. The first protective layer covers at least the first lead segment and the third lead segment. At least one opening is disposed in the first protective layer, and at least a portion of the second lead segment is exposed by an opening in the at least one opening. The at least a portion of the second lead segment exposed by the opening is configured to be connected to a circuit board.

In some embodiments, forming the first protective layer, includes: forming a first mask layer and a second mask layer, the first mask layer partially covering the first surface, and being non-overlapped with the first lead segment, and the second mask layer at least covering at least a portion of the second lead segment; patterning the second mask layer to obtain at least one mask pattern such that the at least a portion of the second lead segment is covered by a mask pattern in the at least one mask pattern; forming a protective film based on the first mask layer and the at least one mask pattern; and removing the first mask layer and the at least one mask pattern to remove a portion of the protective film located on the first mask layer and a portion of the protective film located on the at least one mask pattern, so that a portion of the protective film that is non-removed serves as the first protective layer.

In some embodiments, patterning the second mask layer to obtain the at least one mask pattern such that the at least a portion of the second lead segment is covered by the mask pattern, includes: cutting the second mask layer by laser to form the at least one mask pattern and a pre-peeled pattern separated from the at least one mask pattern; and removing the pre-peeled pattern to obtain the at least one mask pattern such that the at least a portion of the second lead segment is covered by the mask pattern.

In some embodiments, removing the first mask layer and the at least one mask pattern, includes: removing the first mask layer; placing the backplane covered with the at least one mask pattern into an ultrasonic device containing alcohol for cleaning; and removing the at least one mask pattern by using a water washing process.

In yet another aspect, a display device is provided. The display device includes the display panel in any one of the above embodiments.

In yet another aspect, a splicing display device is provided. The splicing display device includes a plurality of display devices in any one of the above embodiments that are spliced and assembled.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
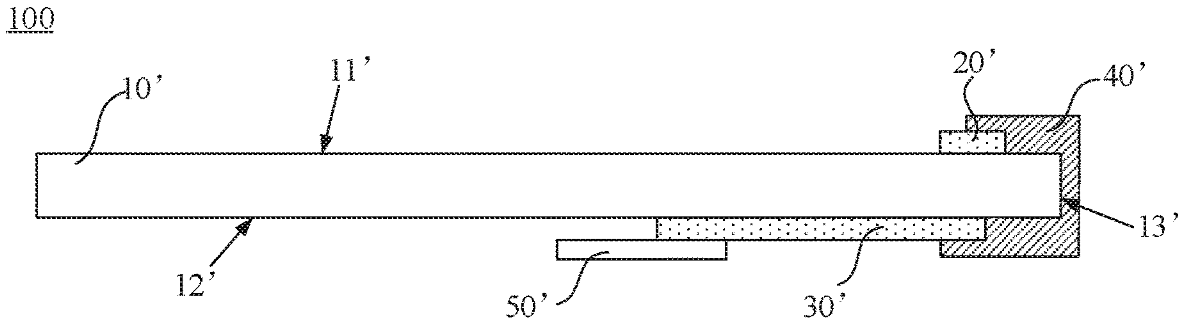
FIG. 1 is a structural diagram of a display panel, in accordance with the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1, the related art provides a display panel 100. The display panel 100 includes a backplane 10', a first pad 20', a second pad 30', a connection lead 40' and a circuit board 50'.

The backplane 10' includes a first surface 11' and a second surface 12' opposite to each other, and side surface(s) 13' connecting the first surface 11' and the second surface 12'. The first pad 20' is located on the first surface 11', and the second pad 30' is located on the second surface 12'. The first pad 20' is configured to be connected to circuit structure(s) (e.g., pixel driving circuit(s)) in the backplane 10'.

The connection lead 40' is located on the backplane 10', and extends from the first surface 11' to the second surface 12' via the side surface 13'. Two ends of the connection lead 40' are respectively connected to the first pad 20' and the second pad 30'.

The circuit board 50' is located on a side of the backplane 10' where the second surface 12' is located, and is connected to the second pad 30'. In this way, the circuit board 50' is connected to electrical pattern(s) and electronic device(s) in the backplane 10' through the second pad 30', the connection lead 40' and the first pad 20' that are connected, thereby controlling the electronic device(s).

However, since the electrical pattern(s), the electronic device(s) and the first pad 20' are disposed on the first surface 11' of the backplane 10', and the second pad 30' is disposed on the second surface 12' of the backplane 10', in a manufacturing process of the display panel 100, in order to manufacture related structures on two sides of the backplane 10', the backplane 10' needs to be turned over after the structures are manufactured on a surface of the backplane 10', and then, the structures are manufactured on another surface of the backplane 10'. In this process, a scratching problem easily occurs on a surface of the backplane 10', which affects a yield of the display panel 100. Moreover, the above manufacturing process is complicated, and has many steps and high manufacturing costs.

Figure 2:
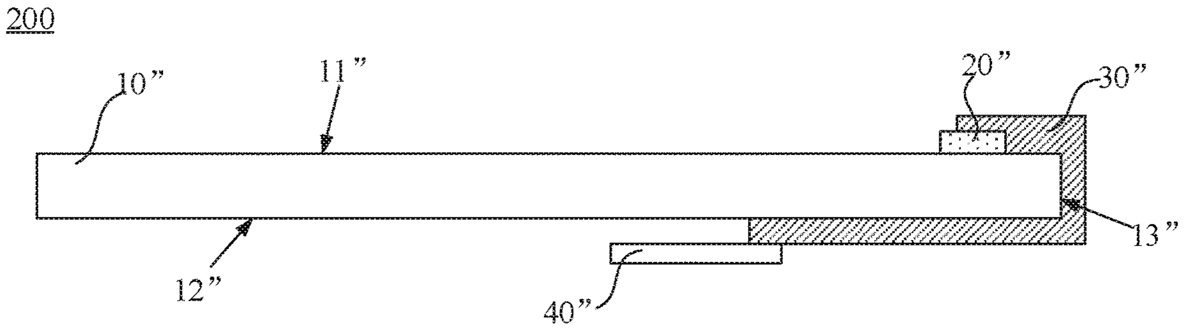
FIG. 2 is a structural diagram of another display panel, in accordance with the related art.

As shown in FIG. 2, the related art further provides another display panel 200. The display panel 200 includes a backplane 10", a first pad 20", a connection lead 30" and a circuit board 40".

The backplane 10" includes a first surface 11" and a second surface 12" opposite to each other, and side surface(s) 13" connecting the first surface 11" and the second surface 12". The first pad 20" is located on the first surface 11". The first pad 20" is configured to be connected to electrical pattern(s) or electronic device(s) in the backplane 10", and is connected to the connection lead 30".

The connection lead 30" is located on the backplane 10", and extends from the first surface 11" to the second surface 12" of the backplane 10" via the side surface 13".

The circuit board 40" is located on a side of the backplane 10" where the second surface 12" is located, and is connected to the connection lead 30". The circuit board 40" is connected to the electrical pattern(s) and electronic device(s) in the backplane 10" through the first pad 20" and the connection lead 30" connected to each other, thereby controlling the electronic device(s).

In this way, the second surface 12" of the backplane 10" is not provided with a second pad, so that in the manufacturing process of the display panel 100, the backplane 10" does not need to be turned over, thereby avoiding the scratching problem and improving the yield of the display panel 200. Moreover, the second pad and other circuit structures are not disposed on the second surface 12" of the backplane 10", so that the manufacturing process of the display panel 200 is simple, thereby saving at least one film forming and patterning process, so as to reduce manufacturing costs of the display panel 200.

However, referring to FIG. 2, the connection lead 30" connected to the circuit board 40" in the display panel 200 is directly exposed to an external environment, so that the connection lead 30" is easily eroded by water vapor and oxygen in the external environment, thereby increasing a resistance of the connection lead 30", and seriously breaking the connection lead 30".

Figure 3:
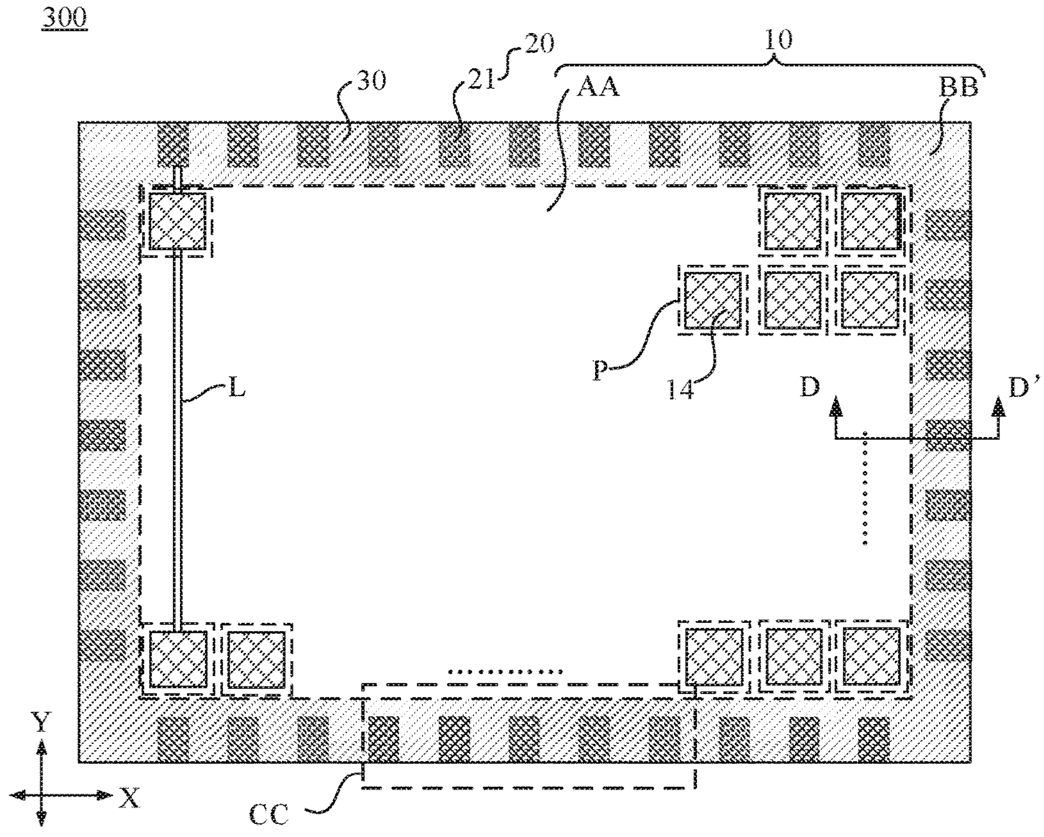
FIG. 3 is a top view of a display panel, in accordance with some embodiments.
Figure 4:
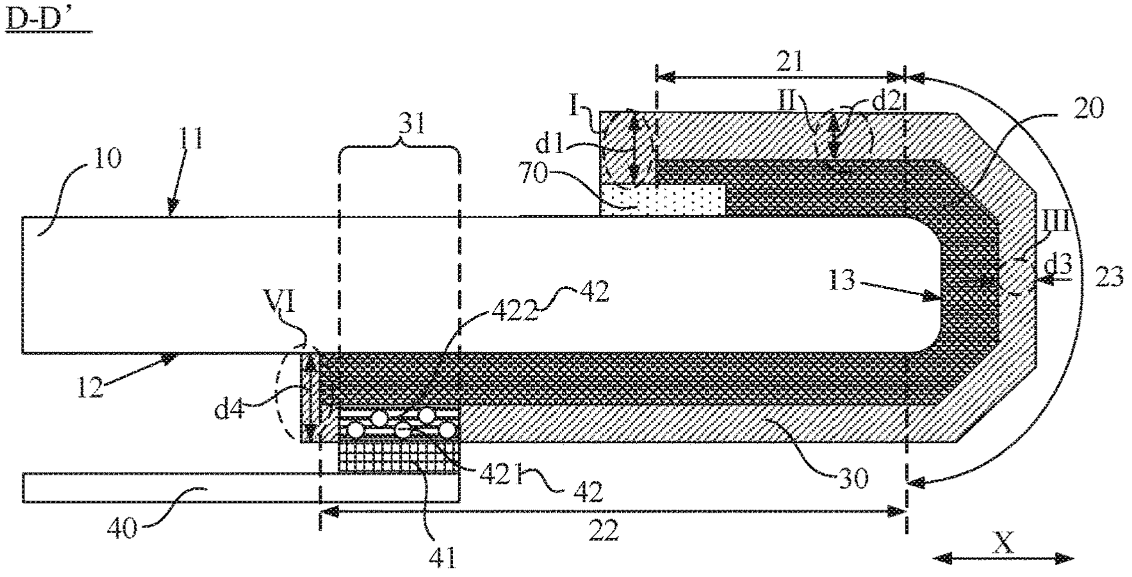
FIG. 4 is a sectional view of the display panel in FIG. 3 at D-D'.

Based on the above problem, as shown in FIGS. 3 and 4, some embodiments of the present disclosure provide a display panel 300. The display panel 300 includes a backplane 10, connection lead(s) 20 and a first protective layer 30.

The backplane 10 includes a first surface 11 and a second surface 12 opposite to each other, and side surface(s) 13 connecting the first surface 11 and the second surface 12.

For example, the first surface 11 may be a display surface of the backplane 10, and the second surface 12 may be a non-display surface of the backplane 10.

For example, as shown in FIG. 3, the first surface 11 and the second surface 12 each may be substantially in a rectangular shape. In this case, the backplane 10 may be substantially a rectangular parallelepiped, and may include four side surfaces 13. It can be understood that the shapes of the first surface 11 and the second surface 12 are not limited thereto. For example, the first surface 11 and the second surface 12 each may be in a hexagonal shape, and in this case, the backplane 10 may include six side surfaces 13.

It can be understood that the phrase "substantially in the rectangular shape" means that the first surface 11 and the second surface 12 each are in the rectangular shape in its entirety, but is not limited to a standard rectangular shape. That is, the phrase "rectangular shape" here includes not only a basic rectangular shape, but also shapes similar to the rectangular shape in consideration of process conditions.

In some examples, the side surface 13 may be a plane. In some other examples, the side surface 13 may be a curved surface. In yet other examples, the side surface 13 may include a plurality of planes connected in sequence, and the plurality of planes are not coplanar (for example, the side surface 13 may include three planes). In yet other examples, as shown in FIG. 4, the side surface 13 may include two arc-shaped surfaces respectively connected to the first surface 11 and the second surface 12, and a plane connected to the two arc-shaped surfaces.

The connection lead(s) 20 are disposed on the backplane 10, and each extend from the first surface 11 to the second surface 12 via the side surface 13. The connection lead 20 includes a first lead segment 21 located on the first surface 11, a second lead segment 22 located on the second surface 12, and a third lead segment 23 connecting the first lead segment 21 and the second lead segment 22. The third lead segment 23 is located on the side surface 13.

For example, the connection lead 20 may have a single-layer structure or a multi-layer structure. In a case where the connection lead 20 has the single-layer structure, a material of the connection lead 20 may include metal such as copper. In a case where the connection lead 20 has the multi-layer structure, the connection lead 20 may have a metal stacked structure of titanium/aluminum/titanium, molybdenum/aluminum/molybdenum or titanium/copper/titanium. Alternatively, the connection lead may include a first buffer conductive material, a main material and a second buffer conductive material that are stacked in sequence. An adhesion between the first buffer conductive material and the backplane is greater than an adhesion between the main material and the backplane. An oxidation resistance of the second buffer conductive material is better than an oxidation resistance of the main material. The first buffer conductive material and the second buffer conductive material are the same, and include at least one of titanium, chromium, molybdenum and molybdenum-niobium alloy. The main material may be copper.

As shown in FIG. 3, the backplane 10 has a display area AA and a non-display area BB located on at least one side of the display area AA. FIG. 3 illustrates the non-display area BB around the display area AA.

The backplane 10 further includes sub-pixels P of a plurality of colors and a plurality of signal lines L in the display area AA. The sub-pixels P of the plurality of colors include at least sub-pixels of a first color, sub-pixels of a second color and sub-pixels of a third color. The first color, the second color and the third color may be three primary colors (e.g., red, green and blue, respectively).

For example, a plurality of sub-pixels P may be arranged in a matrix. Sub-pixels P arranged in a line in a horizontal direction X are referred to as a row of sub-pixels, and sub-pixels P arranged in a line in a vertical direction Y are referred to as a column of sub-pixels.

For example, as shown in FIG. 3, each sub-pixel P may include a light-emitting device 14 and a pixel driving circuit (not shown). The pixel driving circuit is used for driving the light-emitting device 14 to emit light.

For example, the pixel driving circuit may include a plurality of thin film transistors and at least one capacitive memory. The thin film transistor may include an active layer, a first gate insulating layer, a gate, a second gate insulating layer, a source and a drain.

The plurality of thin film transistors may be N-type transistors or P-type transistors, or may include N-type transistor(s) and P-type transistor(s), which may be designed according to actual needs. In addition, the plurality of thin film transistors included in the pixel driving circuit may be low temperature polysilicon (LTPS) transistors or oxide transistors, or may include low temperature polysilicon transistor(s) and oxide transistor(s).

For example, the plurality of signal lines L each may be a gate line, a data line or a supply voltage line. In a case where a signal line L is a gate line, this signal line L may extend in the horizontal direction X, and may be electrically connected to a row of sub-pixels P to control this row of sub-pixels P to be turned on or off. In a case where a signal line L is a data line, this signal line L may extend in the vertical direction Y, and may be electrically connected to a column of sub-pixels P to supply a data signal to this corresponding column of sub-pixels P. In a case where a signal line L is a supply voltage line, this signal line L may extend in the vertical direction Y, and may be electrically connected to at least one column of sub-pixels P to supply a supply voltage (e.g., high-level voltage or low-level voltage) to the corresponding column(s) of sub-pixels P.

For example, the first lead segment 21 of the connection lead 20 may be electrically connected to a signal line L by direct contact. In order to prevent the first lead segment 21 from affecting the normal display of the display panel 300, the first lead segment 21 may be located in the non-display area BB.

As shown in FIG. 4, the first protective layer 30 covers at least first lead segment(s) 21 and third lead segment(s) 23 of the connection lead(s) 20. Opening(s) 31 are provided in the first protective layer 30, and at least a portion of each of second lead segment(s) 22 of the connection lead(s) 20 is exposed by an opening 31. The at least a portion of the second lead segment 22 exposed by the opening 31 is configured to be connected to a circuit board 40.

For example, the first protective layer 30 may cover only the first lead segment(s) 21 and the third lead segment(s) 23, and in this case, the second lead segment(s) 22 are entirely exposed by the opening(s) 31.

For example, the first protective layer 30 not only covers the first lead segment(s) 21 and the third lead segment(s) 23, but also covers a portion of each of the second lead segment(s) 22. That is, in this case, the portion of the second lead segment 22 is exposed by the opening 31.

Figure 5A:
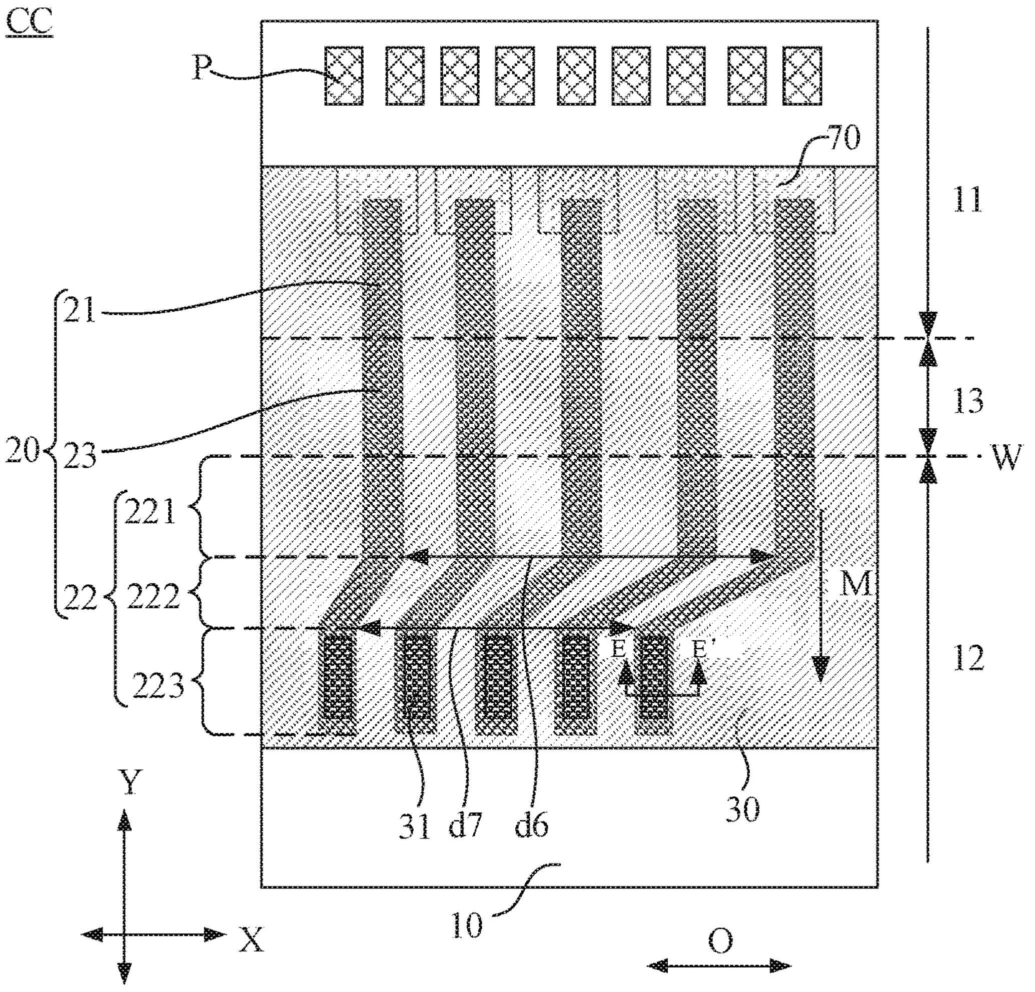
FIG. 5A is an unfolded view of the CC region of the display panel shown in FIG. 3.

In some embodiments of the present disclosure, a shape of the opening 31 is not limited. For example, as shown in FIG. 5A, an orthogonal projection of the opening 31 on the second surface 12 may be substantially in a rectangular shape.

The phrase "substantially in the rectangular shape" means that the orthogonal projection of the opening 31 on the second surface 12 is in the rectangular shape in its entirety, but is not limited to a standard rectangular shape. That is, the phrase "the rectangular shape" here includes not only a basic rectangular shape, but also shapes similar to the rectangular shape in consideration of process conditions.

The at least a portion of the second lead segment 22 exposed by the opening 31 is configured to be connected to the circuit board 40. In this way, the connection lead 20 is connected to both the signal line L and the circuit board 40, so that an electrical signal sent by the circuit board 40 may be transmitted to the signal line L through the connection lead 20, so as to control sub-pixels P in the backplane 10 by the circuit board 40.

For example, the at least a portion of the second lead segment 22 exposed by the opening 31 is configured to be connected to the circuit board 40, which may be that the at least a portion of the second lead segment 22 exposed by the opening 31 is configured to be bonded to the circuit board 40.

For example, the first protective layer 30 may be made of a material with a high hydrophobicity. For example, the material of the first protective layer 30 may include silicon nitride.

In a case where the material of the first protective layer 30 includes silicon nitride, for example, the first protective layer 30 may be manufactured by using a sputtering process, so that the first protective layer 30 is thin, and has a uniform thickness at different positions. In this way, after a plurality of display devices each having the display panel 300 are spliced and assembled to form a splicing display device, ultra-narrow splicing seam(s) of the splicing display device are favorably realized.

For example, the thickness of the first protective layer 30 may be in a range of 1500 angstroms to 7500 angstroms. For example, the thickness of the first protective layer 30 may be 1500 angstroms, 2000 angstroms, 2500 angstroms, 3000 angstroms, 4000 angstroms, 5000 angstroms, 6000 angstroms, or 7500 angstroms.

In some embodiments, the first protective layer 30 may have different film thicknesses at different positions. For example, as shown in FIG. 4, the first protective layer 30 has a thickness d1 at the I position, the first protective layer 30 has a thickness d2 at the II position, the first protective layer 30 has a thickness d3 at the III position, and the first protective layer 30 has a thickness d4 at the VI position. At least two of d1, d2, d3 and d4 are different.

In some examples, the thickness d3 of the first protective layer 30 at the III position may be greater than or less than the thickness d2 of the first protective layer 30 at the II position.

Figure 5B:
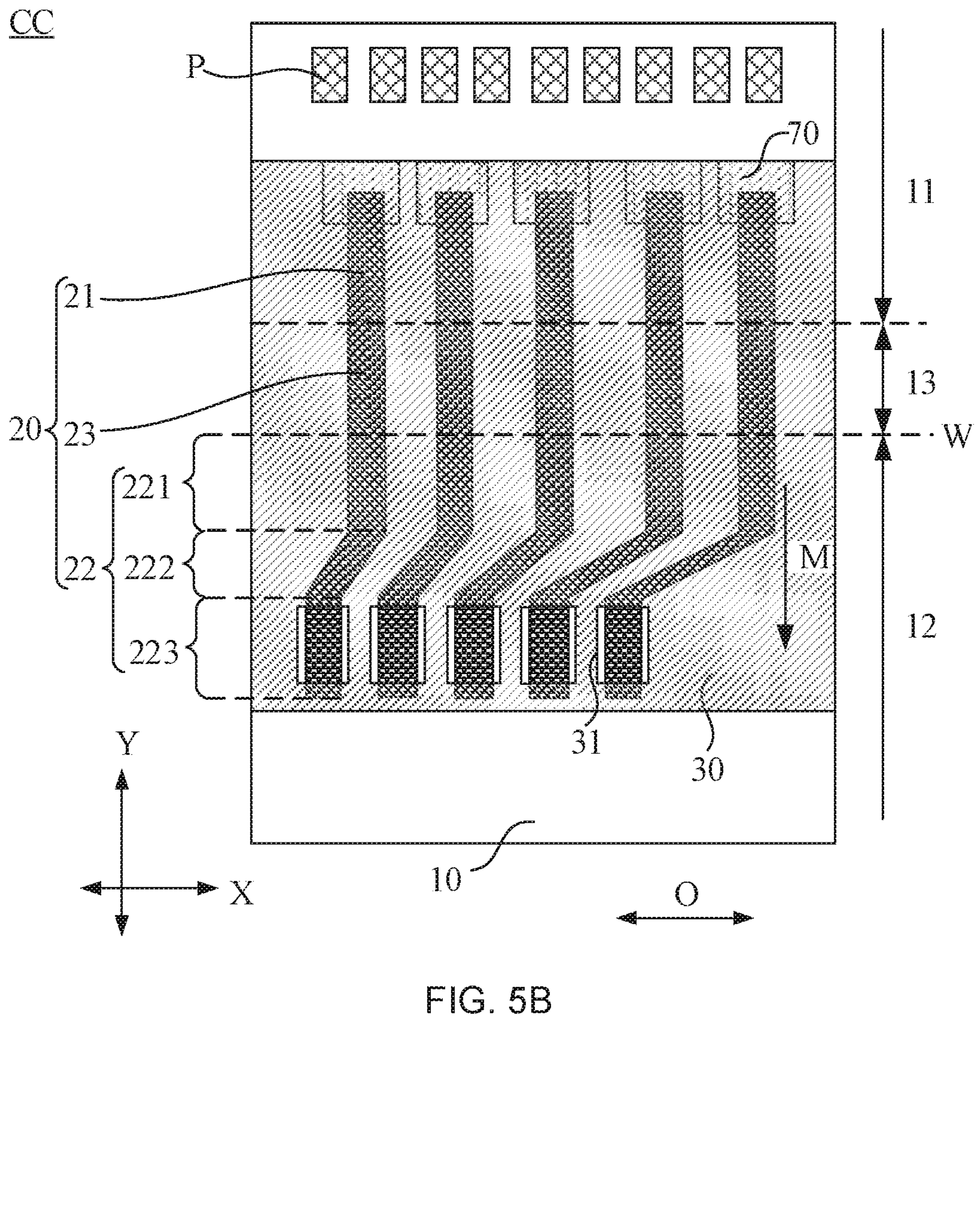
FIG. 5B is another unfolded view of the CC region of the display panel shown in FIG. 3.
Figure 5C:
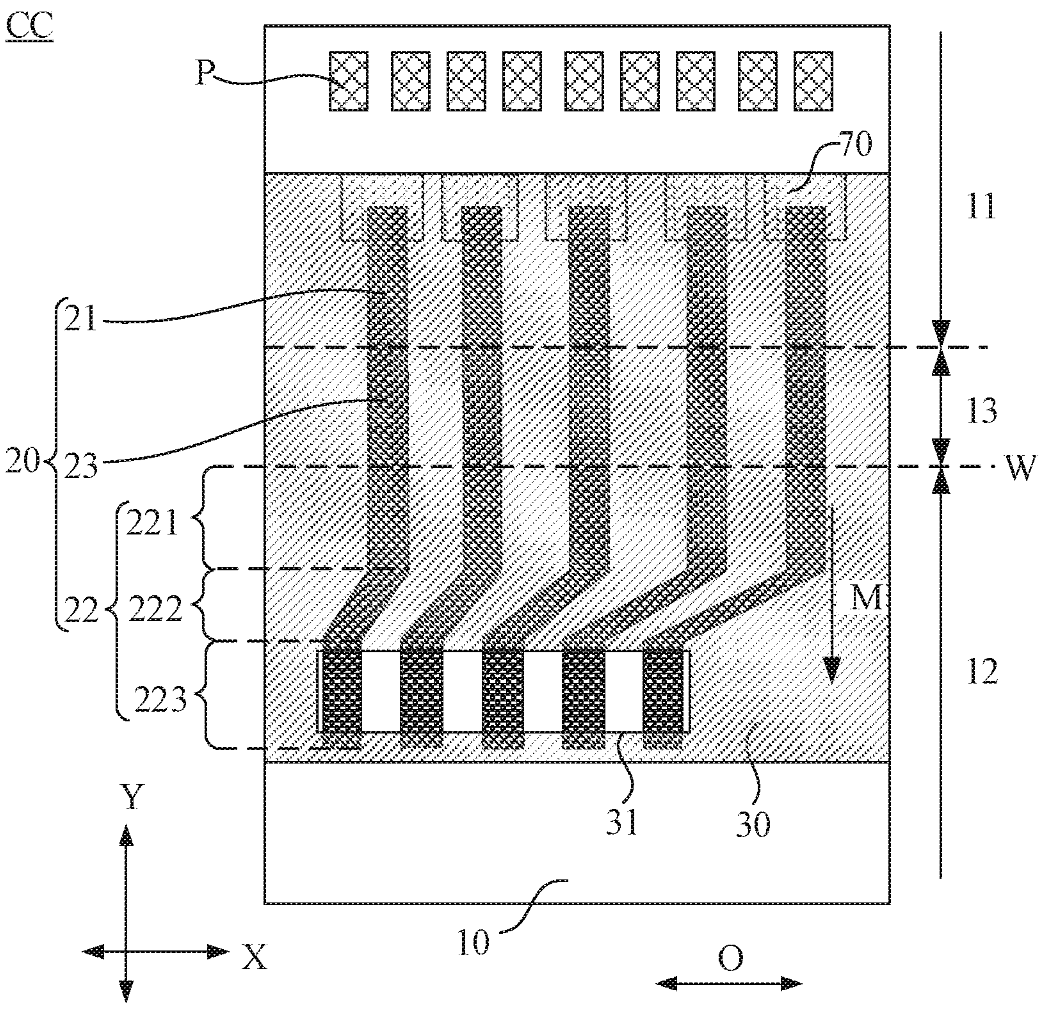
FIG. 5C is yet another unfolded view of the CC region of the display panel shown in FIG. 3.

In some embodiments, as shown in FIG. 3, in order to prevent the first lead segment(s) 21 from affecting a display image of the display panel 300, the first lead segment(s) 21 may be located in the non-display area BB. As shown in FIGS. 5A to 5C, the first protective layer 30 further covers regions respectively located at two sides of each of the connection lead(s) 20 in a first direction O (see below). The first protective layer 30 may cover the non-display area BB without covering the display area AA.

Since the first protective layer 30 further covers the regions respectively located on the two sides of each of the connection lead(s) 20 in the first direction O, the first protective layer 30 may protect the sides of each of the connection lead(s) 20, so as to further prevent the connection lead(s) 20 from being eroded by water vapor and oxygen. The first protective layer 30 does not cover the display area AA, so that after the first protective layer 30 is manufactured, electronic components (e.g., micro light-emitting diodes, sensors and micro drivers) may be provided at respective positions of the backplane 10.

As shown in FIG. 4, in some embodiments, the display panel 300 further includes the circuit board 40. The circuit board 40 is located on a side of the backplane 10 where the second surface 12 is located, and is connected to the second lead segment(s) 22 through the opening(s) 31. For example, the circuit board 40 may be a flexible printed circuit (FPC).

In some embodiments, as shown in FIG. 4, the circuit board 40 may include conductive contact piece(s) 41 configured to be connected to the second lead segment(s) 22 of the connection lead(s) 20.

In some examples, as shown in FIG. 4, an extending direction of the conductive contact piece 41 is substantially the same as an extending direction of the second lead segment 22.

In some examples, the conductive contact piece 41 may have a single-layer structure or a multi-layer structure. In a case where the conductive contact piece 41 has the single-layer structure, a material of the conductive contact piece 41 may include metal such as copper. In a case where the conductive contact piece 41 has the multi-layer structure, the conductive contact piece 41 may have a metal stacked structure of titanium/aluminum/titanium, molybdenum/aluminum/molybdenum or titanium/copper/titanium, or may have a structure with a main material of copper and a surface plated with gold.

A shape and a size of the conductive contact piece 41 are not limited. In some examples, the shape and the size of the conductive contact piece 41 may be respectively the same as a shape and a size of the at least a portion of the second lead segment 22 exposed by the opening 31. In some other examples, the shape and the size of the conductive contact piece 41 may be respectively different from the shape and the size of the at least a portion of the second lead segment 22 exposed by the opening 31.

In some embodiments, as shown in FIG. 4, the display panel 300 may further include conductive adhesive film(s) 42 located between the conductive contact piece(s) 41 and the second lead segment(s) 22. The conductive adhesive film 42 is in direct contact with conductive contact piece(s) 41 and second lead segment(s) 22.

For example, the conductive adhesive film 42 may include a plurality of conductive microspheres 421 and an insulator 422. The plurality of conductive microspheres 421 are embedded in the insulator 422 in a separated state, and both the conductive microspheres 421 and the insulator 422 of the conductive adhesive film 42 have characteristics of adhesion and deformation. For example, the conductive adhesive film 42 may be an anisotropic conductive film. The conductive microspheres 421 have a particle size of about 5 μm, and a density of the conductive microspheres 421 in the insulator 422 is about 2 times $10^5/mm^2$. For example, the conductive microsphere 421 has a structure with a surface including gold and nickel and resin inside. Conductive microspheres 421 are crushed when subjected to a certain pressing force, so that metal particles in these conductive microspheres 421 are embedded in the conductive contact piece 41 and/or the second lead segment 22, so as to respectively electrically connect the conductive contact piece 41 to the second lead segment 22.

In some embodiments, as shown in FIG. 4, the conductive contact piece(s) 41 and the second lead segment(s) 22 are respectively electrically connected by the adhesion and deformation characteristics of the conductive microspheres 421 and the insulator 422 of the conductive adhesive film 42 and the conductive action of the conductive microspheres 421.

In the display panel 300 provided in some embodiments of the present disclosure, the circuit board 40 is directly connected to the second lead segment(s) 22 of the connection lead(s) 20 located on the second surface 12, so that other circuit structure(s) are not required to be provided on the second surface 12, which effectively simplifies a structure and a manufacturing process of the display panel 300, so as to reduce manufacturing costs of the display panel, and improve a yield of the display panel 300. Moreover, except a portion of the connection lead 20 configured to be connected to the circuit board 40 (i.e., the at least a portion of the second lead segment 22 exposed by the opening 31), the rest of the connection lead 20 is covered by the first protective layer 30, and is difficult to be eroded by water vapor and oxygen in the air, so that a yield of the connection lead 20 is effectively improved. Thus, the yield of the display panel 300 is effectively improved, and the service life of the display panel 300 is effectively prolonged.

Figure 6:
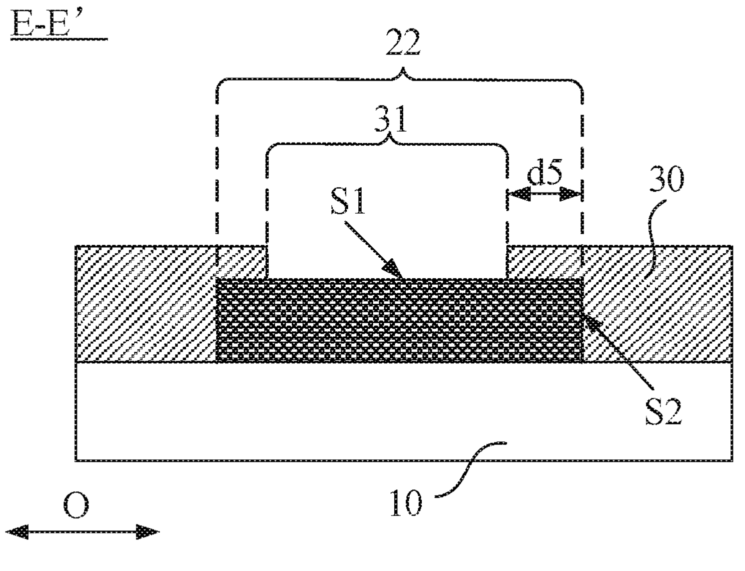
FIG. 6 is a sectional view at E-E' in FIG. 5A.

In some embodiments, as shown in FIGS. 5A and 6, the orthogonal projection of the opening 31 on the second surface 12 is located within an orthographic projection of the second lead segment 22 on the second surface 12, and in the first direction O, each of two borders of the opening 31 and a respective one of two borders of a portion of the second lead segment 22 corresponding to the opening 31 have a distance d5 therebetween. The distance d5 is greater than 0. The first direction O is parallel to a boundary line W of the side surface 13 and the second surface 12.

It can be understood that a boundary line W of a different side surface 13 and the second surface 12 may have a different extending direction. When the side surface at which the connection lead 20 is located is different, the first direction O may be different. FIG. 5A exemplarily illustrates that the boundary line W of the side surface 13 and the second surface 12 extends in the horizontal direction X, and the first direction O is parallel to the horizontal direction X.

In this way, referring to FIGS. 5A and 6, only a portion of a top surface S1, away from the backplane 10, of the portion of the second lead segment 22 corresponding to the opening 31 is exposed by the opening 31, and sides S2 of the second lead segment 22 in the first direction O are covered by the first protective layer 30. Therefore, water vapor and oxygen are difficult to erode the second lead segment 22 from the sides of the second lead segment 22, so that the connection lead 20 is more difficult to be eroded by water vapor and oxygen in the environment, thereby further improving the yield of the display panel 300 and prolonging the service life of the display panel 300.

In some other embodiments, as shown in FIG. 5B, in the first direction O, a dimension of the opening 31 is greater than a dimension of the portion of the second lead segment 22 corresponding to the opening 31.

Here, "in the first direction O, the dimension of the opening 31 is greater than the dimension of the portion of the second lead segment 22 corresponding to the opening 31", which may be that, for example, as shown in FIG. 5B, in the first direction O, the two borders of the portion of the second lead segment 22 corresponding to the opening 31 are located between the two borders of the opening 31; for another example, in the first direction O, an orthographic projection, on the second surface 12, of a border of the portion of the second lead segment 22 corresponding to the opening 31 is overlapped with an orthogonal projection of a respective border of the opening 31 on the second surface 12, and another border of the portion of the second lead segment 22 corresponding to the opening 31 is located between the two borders of the opening 31.

In this way, the top surface S1, away from the backplane 10, of the portion of the second lead segment 22 corresponding to the opening 31 is entirely exposed by the opening 31, so that a surface of the second lead segment 22 configured to be bonded to the circuit board 40 has a large area, which is conducive to bonding the second lead segment 22 to the circuit board 40, so as to improve a connection stability of the second lead segment 22 and the circuit board 40 at a bonding position.

In some embodiments, as shown in FIGS. 5A, 5B and 5C, the display panel 300 includes a plurality of connection leads 20. Second lead segments 22 of connection leads 20 located at the same side surface are arranged at interval(s) in the first direction O. The first direction O is parallel to the boundary line of the side surface 13 and the second surface 12.

A specific number of the connection lead(s) 20 is not limited in some embodiments of the present disclosure, which may be designed according to actual needs. In the first direction O, a distance between any second lead segment 22 and an adjacent second lead segment 22 may be different from or the same as a distance between the any second lead segment 22 and another adjacent second lead segment 22. In the first direction O, a distance between a position on a border of the second lead segment 22 and a border of an adjacent second lead segment 22 may be different from or the same as a distance between a different position on the border of the second lead segment 22 and the border of the adjacent second lead segment 22.

Figure 7:
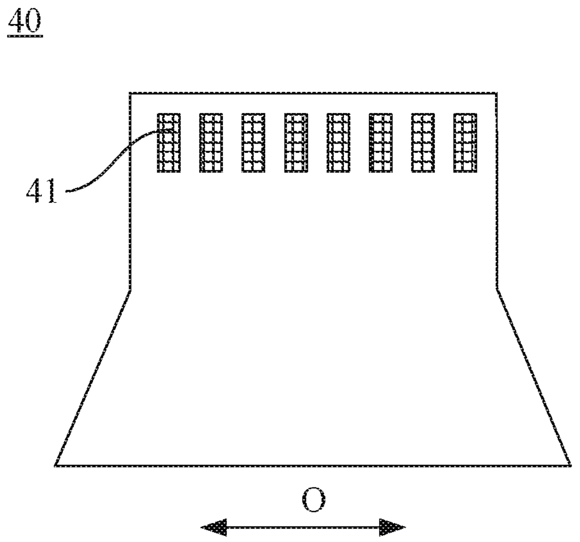
FIG. 7 is a structural diagram of a circuit board, in accordance with some embodiments.

In some examples, as shown in FIG. 7, the circuit board 40 may include a plurality of conductive contact pieces 41. Conductive contact pieces 41, which are respectively connected to the second lead segments 22 of the connection leads 20 located at the same side surface, are arranged at interval(s) in the first direction O. The conductive contact piece 41 is configured to be connected to the second lead segment 22 of the connection lead 20. That is, the number of the conductive contact pieces 41 is the same as the number of the second lead segments 22.

In some examples, as shown in FIGS. 5A and 5B, a plurality of openings 31 are disposed in the first protective layer 30, and openings 31, which respectively correspond to the second lead segments 22 of the connection leads 20 located at the same side surface, are arranged at interval(s) in the first direction O. The opening 31 exposes at least the portion of the second lead segment 22 of the connection lead 20.

For example, the plurality of openings 31 may have the same size and shape, which is convenient for manufacturing the first protective layer 30.

In this way, the second lead segment 22 of each connection lead 20 may be bonded to the circuit board 40. Moreover, except a portion of each connection lead 20 configured to be bonded to the circuit board 40, the rest of each connection lead 20 is covered by the first protective layer 30, and is difficult to be eroded by water vapor and oxygen in the environment.

Based on this, referring to FIG. 4, each opening 31 may be provided with the conductive adhesive film 42. In a process of bonding the second lead segment 22 to the circuit board 40, after the conductive microspheres 421 in the conductive adhesive film 42 are deformed by hot pressing, the metal particles in the conductive microspheres 421 are embedded in the conductive contact piece 41 and the second lead segment 22, so as to electrically connect the conductive contact piece 41 to the second lead segment 22.

In some other examples, as shown in FIG. 5C, at least one opening 31 is disposed in the first protective layer 30, and an opening 31 expose at least a portion of each of second lead segments 22 of connection leads 20. In this case, in the first direction O, two borders of the at least a portion of the second lead segment 22 exposed by the opening 31 are located between two borders of the opening 31.

Here, "the at least one opening 31 is disposed in the first protective layer 30", which may be that, for example, a single opening 31 is disposed in the first protective layer 30; for another example, at least two openings 31 are disposed in the first protective layer 30.

In a case where the at least two openings 31 are disposed in the first protective layer 30, openings 31, which correspond to the second lead segments 22 of the connection leads 20 located at the same side surface, may be arranged at interval(s) in the first direction O. In the case where the at least two openings 31 are disposed in the first protective layer 30, the number of connection leads 20 exposed by an opening 31 may be the same as or different from the number of connection leads 20 exposed by a different opening 31.

It can be understood that FIG. 5C only illustrates that an opening 31 exposes at least a portion of each of second lead segments 22 of five connection leads 20. The number of the opening(s) 31 and the number of connection leads 20 that each opening 31 exposes are not limited thereto in some embodiments of the present disclosure.

In this way, the second lead segment 22 of each connection lead 20 may be bonded to the circuit board 40. Moreover, except the portion of each connection lead 20 configured to be bonded to the circuit board 40, the rest of each connection lead 20 is covered by the first protective layer 30, and is difficult to be eroded by water vapor and oxygen in the environment. Moreover, the connection leads 20 each are at least partially exposed by the single opening 31, so that the number of opening(s) 31 disposed in the first protective layer 30 may be small, thereby simplifying a patterning process of the first protective layer 30, which is conducive to improving a manufacuring efficiency of the display panel.

Based on this, the conductive adhesive film 42 may be located in the opening 31. After conductive microspheres 421 in the conductive adhesive film 42 located between the conductive contact piece 41 and the second lead segment 22 are deformed by hot pressing, metal particles in these conductive microspheres 421 are embedded in the conductive contact piece 41 and the second lead segment 22, so as to electrically connect the conductive contact piece 41 to the second lead segment 22. Conductive microspheres 421 in the conductive adhesive film 42 located between two adjacent second lead segments 22 (or two adjacent conductive contact pieces 41) are not crushed due to an insufficient pressing force, so that this portion of the conductive adhesive film is non-conductive, and the two adjacent second lead segments 22 (or the two adjacent conductive contact pieces 41) are electrically insulated from each other.

In some embodiments, as shown in FIGS. 4, 5A, 5B, 5C, 8A and 8B, a portion of the second lead segment 22 close to the third lead segment 23 is covered by the first protective layer 30. That is, a portion of the second lead segment 22 away from the third lead segment 23 is exposed by the opening 31, and is configured to be bonded to the circuit board 40.

In this way, an orthographic projection of the circuit board 40 on the second surface 12 is close to a center of the second surface 12, and is away from the side surface(s) 13, so that during manufacturing of the splicing display device, problems of a difficult splicing and increased splicing seam(s) caused by a fact that the circuit board 40 is close to an edge of the display device are not easy to occur.

In some examples, as shown in FIGS. 5A, 5B and 5C, the second lead segment 22 includes a first sub-segment 221, a second sub-segment 222 and a third sub-segment 223 connected in sequence. The first sub-segment 221 is connected to the third lead segment 23. An extending direction of the second sub-segment 222 and an extending direction of the first sub-segment 221 intersect, and an extending direction of the third sub-segment 223 is substantially the same as the extending direction of the first sub-segment 221.

In this case, the first sub-segment 221 and the second sub-segment 222 may be covered by the first protective layer 30, and at least a portion of the third sub-segment 223 may be exposed by the opening 31.

The extending direction of the third sub-segment 223 is substantially the same as the extending direction of the first sub-segment 221, which may include a case that the extending direction of the third sub-segment 223 is exactly the same as the extending direction of the first sub-segment 221, and may further include a case that the extending direction of the third sub-segment 223 and the extending direction of the first sub-segment 221 have an included angle within an acceptable range of deviation therebetween. For example, the included angle is less than 5°.

In this way, the first sub-segment 221 and the second sub-segment 222 of the second lead segment 22 may be protected by the first protective layer 30, so that the first sub-segment 221 and the second sub-segment 222 are difficult to be eroded by water vapor and oxygen in the air, so as to improve the yield of the connection lead 20, thereby effectively improving the yield of the display panel 300 and effectively prolonging the service life of the display panel 300.

For example, as shown in FIGS. 5A, 5B and 5C, the first sub-segment 221 and the third sub-segment 223 may extend in a direction perpendicular to the first direction O.

For example, as shown in FIGS. 5A, 5B and 5C, in a case where the display panel 300 includes the plurality of connection leads 20, first sub-segments 221 of connection leads 20 located at the same side surface may be parallel to each other, and third sub-segments 223 of the connection leads 20 located at the same side surface may also be parallel to each other, which is convenient for manufacturing the connection leads 20 and simplifying a manufacturing process of the connection leads 20.

In some possible implementations, as shown in FIGS. 5A, 5B and 5C, the display panel 300 includes the plurality of connection leads 20, and in a direction M from the first sub-segment 221 to the third sub-segment 223, second sub-segments 222 of at least two connection leads 20 located at the same side surface get closer gradually.

In this case, as shown in FIG. 5A, the plurality of connection leads 20 includes two connection leads 20 respectively located at edges of the CC region in the first direction O. In a direction perpendicular to the first direction O and away from the side surface 13, a distance between second sub-segments 222 of the two connection leads 20 respectively located at the edges of the CC region is gradually decreased. That is, a distance d6 between ends of the two second sub-segments 222 respectively connected to first sub-segments 221 of the two connection leads 20 in the first direction O is greater than a distance d7 between ends of the two second sub-segments 222 respectively connected to third sub-segments 223 of the two connection leads 20 in the first direction O.

In this way, in the plurality of connection leads 20, third sub-segments 223 connected to the circuit board 40 and located at the same side surface are arranged at small interval(s), so that an area of a portion of the circuit board 40 connected to the connection leads 20 may be small, so as to reduce an overall area of the circuit board 40.

In some possible implementations, a distance between first sub-segments 221 of any two adjacent connection leads 20 may be equal.

In some other possible implementations, a distance between third sub-segments 223 of any two adjacent connection leads 20 may be equal.

In yet other possible implementations, a distance between first sub-segments 221 of any two adjacent connection leads 20 may be equal, and a distance between third sub-segments 223 of any two adjacent connection leads 20 may be equal.

This is convenient for manufacturing the plurality of connection leads 20, so as to simplify the manufacturing process of the display panel 300.

Figure 8A:
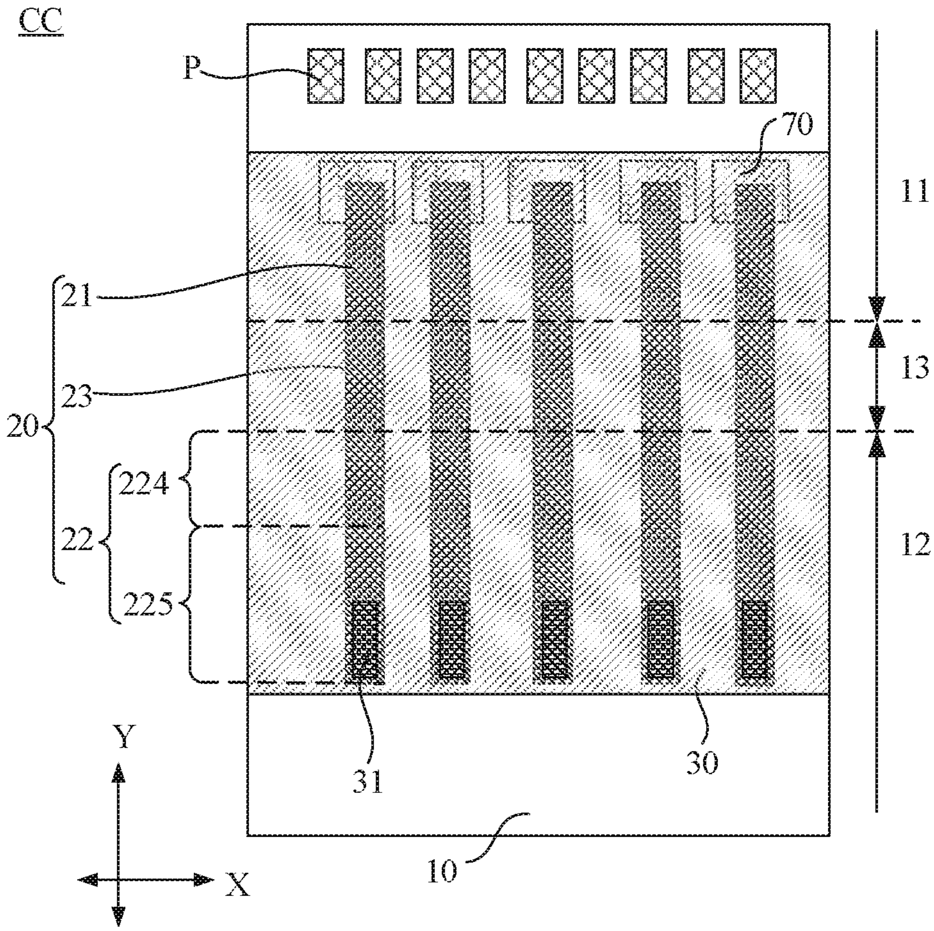
FIG. 8A is yet another unfolded view of the CC region of the display panel shown in FIG. 3.
Figure 8B:
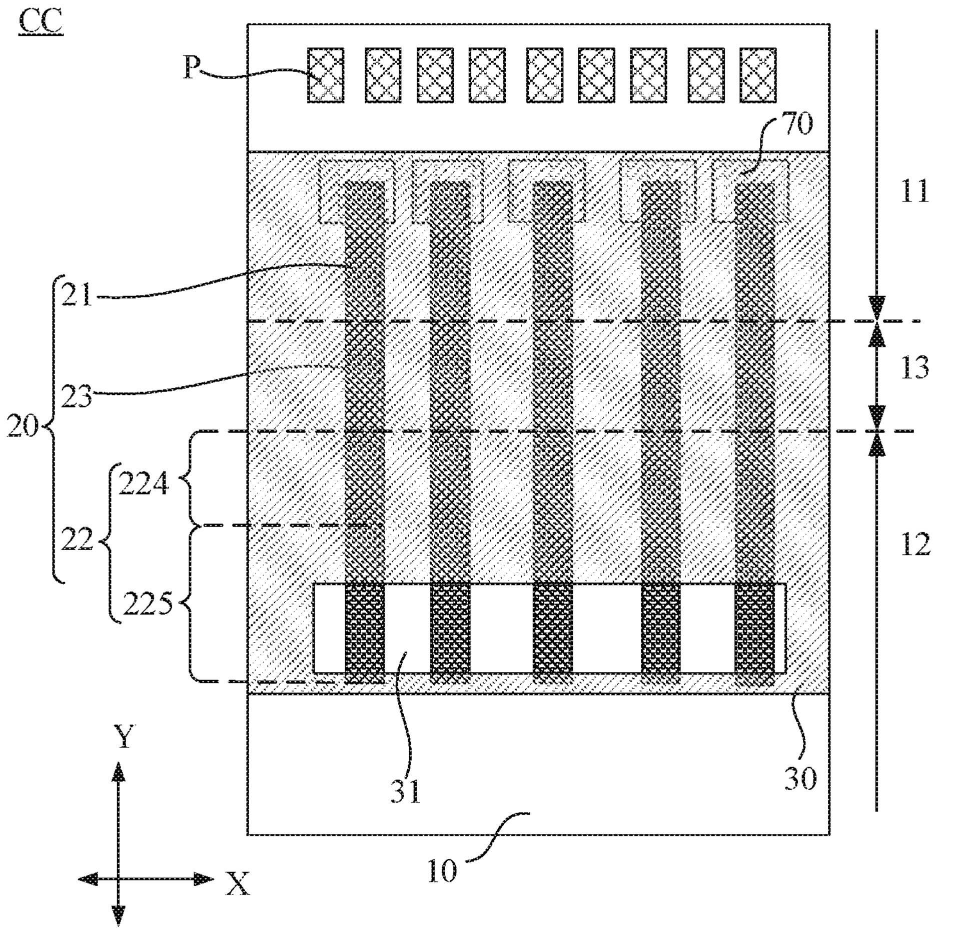
FIG. 8B is yet another unfolded view of the CC region of the display panel shown in FIG. 3.

In some other examples, as shown in FIGS. 8A and 8B, the second lead segment 22 includes a fourth sub-segment 224 and a fifth sub-segment 225 connected in sequence. The fourth sub-segment 224 is connected to the third lead segment 23. The fourth sub-segment 224 and the fifth sub-segment 225 are located on the same straight line. The fourth sub-segment 224 is covered by the first protective layer 30, and at least a portion of the fifth sub-segment 225 is exposed by the opening 31.

In this way, the fourth sub-segment 224 and the fifth sub-segment 225 are located on the same straight line, so that the second lead segment 22 has a simple structure, which is conducive to simplifying the manufacturing process of the connection lead 20 and improving the manufacturing efficiency of the connection lead 20.

Moreover, the fourth sub-segment 224 is covered by the first protective layer 30, and the at least a portion of the fifth sub-segment 225 is exposed by the opening 31, so that the fourth sub-segment 224 of the second lead segment 22 is effectively protected while the bonding of the connection lead 20 to the circuit board 40 is realized. Thus, the fourth sub-segment 224 is difficult to be eroded by water vapor and oxygen in the environment, so that the yield of the connection lead 20 is improved, thereby improving the yield of the display panel and prolonging the service life of the display panel.

For example, extending directions of the fourth sub-segment 224 and the fifth sub-segment 225 are perpendicular to the first direction O.

Figure 9:
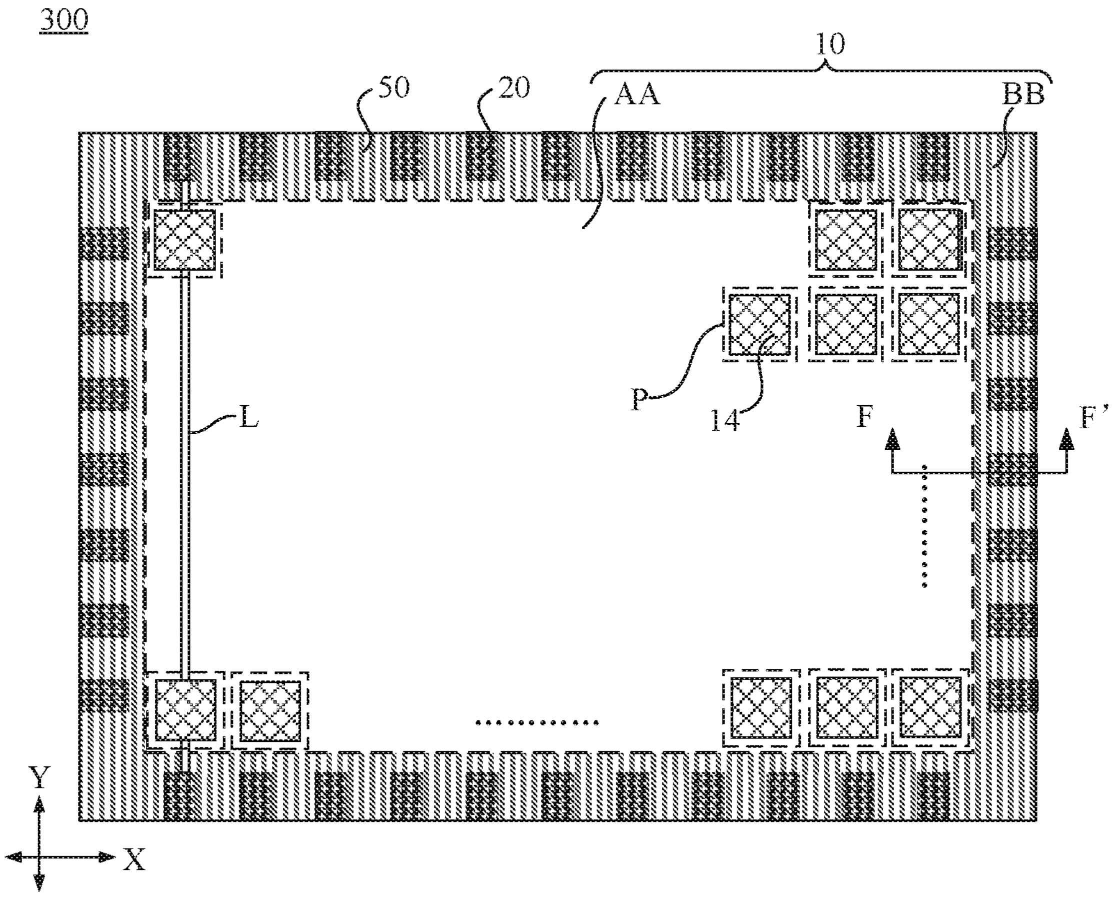
FIG. 9 is a top view of another display panel, in accordance with some embodiments.
Figure 10:
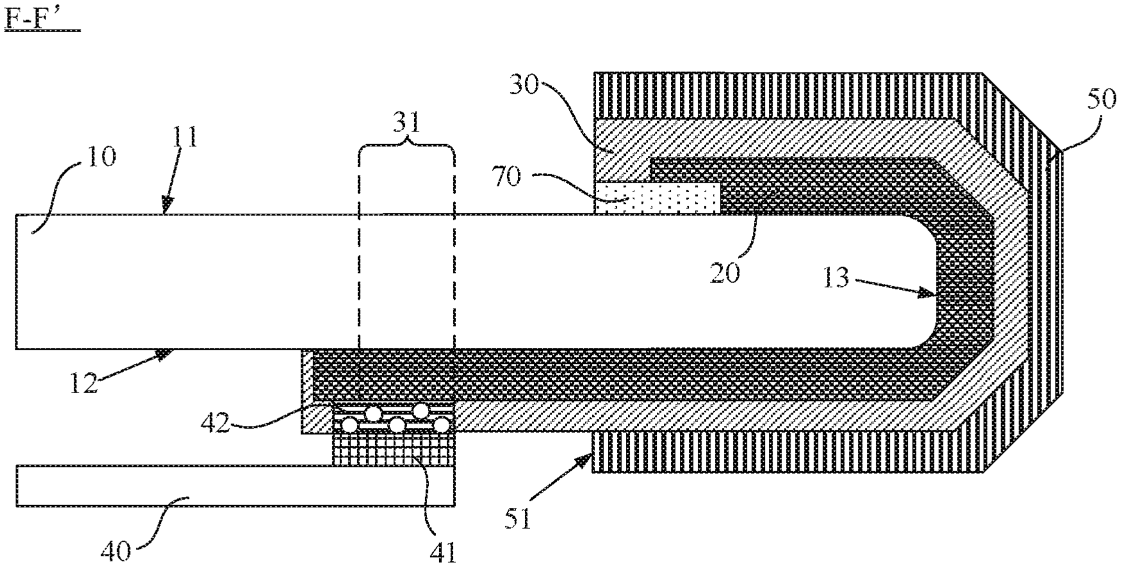
FIG. 10 is a sectional view of the display panel in FIG. 9 at F-F'.

In some embodiments, as shown in FIGS. 9 and 10, the display panel 300 further includes a second protective layer 50. The second protective layer 50 is located on a side of the first protective layer 30 away from the connection lead(s) 20. An orthographic projection of the second protective layer 50 on the second surface 12 is non-overlapped with the orthogonal projection(s) of the opening(s) 31 on the second surface 12.

For example, the second protective layer 50 is made of a material with a high oxidation resistance that is capable of blocking water vapor and oxygen in the environment. For example, the material of the second protective layer 50 may include ink, ultraviolet curing adhesive, or heat curing adhesive.

In this way, the second protective layer 50 is disposed on the side of the first protective layer 30 away from the connection lead(s) 20, and the orthographic projection of the second protective layer 50 on the second surface 12 is non-overlapped with the orthogonal projection(s) of the opening(s) 31 on the second surface 12, so that the portion of the connection lead 20 that is not bonded to the circuit board 40 is protected by both the second protective layer 50 and the first protective layer 30, and is more difficult to be eroded by water vapor and oxygen in the environment, thereby further improving the yield of the connection lead 20, improving the yield of the display panel, and prolonging the service life of the display panel.

For example, a thickness of the second protective layer 50 may be in a range of 0.5 μm to 2 μm. For example, the thickness of the second protective layer 50 may be 0.5 μm, 1 μm, 1.5 μm, or 2 μm.

In this way, on one hand, the connection lead 20 is well protected by using the second protective layer 50, so that the portion of the connection lead 20 that is not bonded to the circuit board 40 is more difficult to be eroded by water vapor and oxygen. On another hand, a wide bezel of the display device and large splicing seam(s) of the splicing display device caused by a thick second protective layer are able to be avoided.

It can be understood that the thickness of the second protective layer 50 is not limited thereto in some embodiments of the present disclosure.

In some embodiments, as shown in FIG. 10, the second protective layer 50 has a border 51 located on the second surface 12, and the opening(s) 31 are located on a side of the border 51 away from the side surface(s) 13.

In this way, the connection lead 20 may be protected by using the second protective layer 50, so that the connection lead 20 is more difficult to be eroded by water vapor and oxygen in the environment, and the second protective layer 50 is able to be prevented from covering the at least a portion of the second lead segment 22 exposed by the opening 31, so as to ensure that the connection lead 20 is bonded to the circuit board 40.

Figure 11:
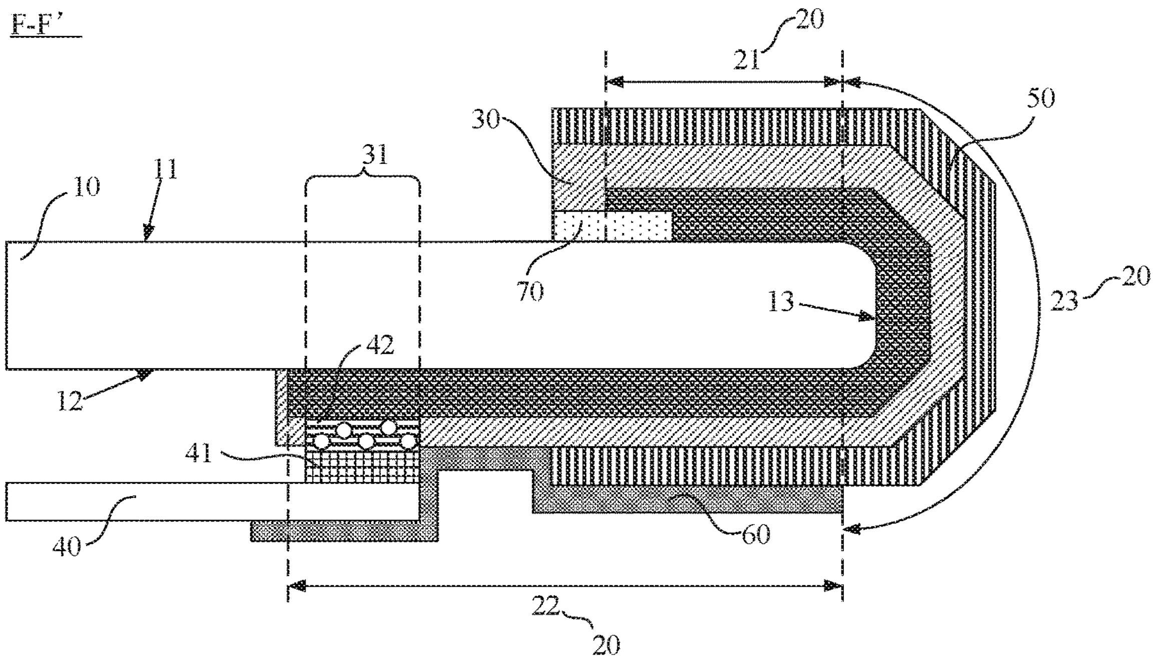
FIG. 11 is another sectional view of the display panel in FIG. 9 at F-F'.
Figure 12:
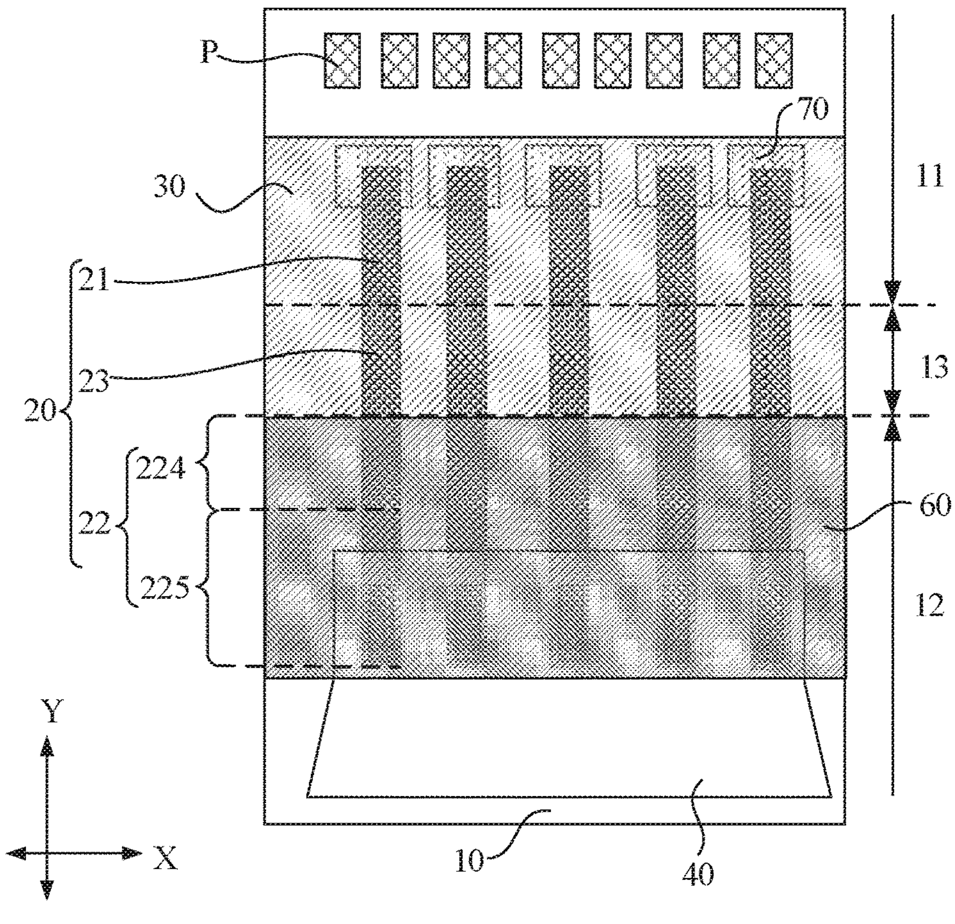
FIG. 12 is yet another unfolded view of the CC region of the display panel shown in FIG. 3.

In some embodiments, as shown in FIGS. 11 and 12, the display panel 300 further includes a third protective layer 60. The third protective layer 60 is disposed on the second surface 12 of the backplane 10. The third protective layer 60 covers a portion of the first protective layer 30 located on the second surface 12 and a portion of the circuit board 40 connected to the second lead segment(s) 22.

For example, the third protective layer 60 may also be made of a material with a high hydrophobicity that is capable of blocking water vapor and oxygen from the outside.

In some possible implementations, the material of the third protective layer 60 includes a fluorine-containing polymer using 1,1,2,2-Tetrafluoroethyl 2,2,2-trifluoroethyl ether as a solvent. For example, the third protective layer 60 is a fluorinating agent layer.

In this way, the third protective layer 60 covers the portion of the first protective layer 30 located on the second surface 12, so that both the third protective layer 60 and the first protective layer 30 are able to protect the connection lead(s) 20, and the connection lead(s) 20 are more difficult to be eroded by water vapor and oxygen in the environment, thereby further improving the yield of the connection lead 20. The third protective layer 60 covers the portion of the circuit board 40 bonded to the second lead segment(s) 22, so that the circuit board 40 is able to be protected, and the circuit board 40 is also difficult to be eroded by water vapor and oxygen in the environment.

As shown in FIG. 11, in a case where the display panel 300 includes the second protective layer 50, the third protective layer 60 may further cover the portion of the second protective layer 50 located on the second surface 12.

In this way, the third protective layer 60 covers the portion of the second protective layer 50, which is able to avoid an adverse effect of generated air holes due to material properties of the second protective layer 50 on the plurality of connection leads 20 in a case where the second protective layer 50 is made of an organic material.

In some embodiments, the third protective layer 60 may cover not only the portion of the first protective layer 30 located on the second surface 12, but also a portion of the first protective layer 30 located on the side surface(s) 13, thereby protecting the third lead segment(s) 23 located on the side surface(s) 13.

In some embodiments, as shown in FIG. 11, the display panel 300 further includes pad(s) 70 located on the first surface 11. The pad(s) 70 are electrically connected to the first lead segment(s) 21 of the connection lead(s) 20. The first protective layer 30 further covers the pad(s) 70.

For example, the pad 70 may be made of metal such as copper.

For example, the pad(s) 70 may be connected to the signal lines L in the above embodiments. The pad(s) 70 and a circuit structure layer in the backplane 10 may be manufactured synchronously. In this way, a conductive film layer does not need to be formed separately, and an additional mask does not need to be used, so as to reduce manufacturing costs of the display panel 300.

For example, an end of the pad 70 connected to the signal line(s) L may extend into the display area AA, and may be located in a gap between adjacent sub-pixels P.

A shape of the pad 70 is not limited. In some examples, referring to FIG. 12, an orthographic projection of the pad 70 on the first surface 11 is substantially in a rectangular shape. In some other examples, the orthographic projection of the pad 70 on the first surface 11 may be substantially in a trapezoidal shape.

The first protective layer 30 further covers the pad(s) 70 to protect the pad(s) 70, so as to prevent the pad(s) 70 from being eroded by water vapor and oxygen in the environment.

In a case where the display panel 30 includes a plurality of pads 70, pads 70, which are respectviely electrically connected to first lead segments 21 of connection leads 20 located at the same side surface, are arranged at interval(s)

in the first direction O. The pad 70 is electrically connected to the first lead segment 21 of the connection lead 20. The first protective layer 30 covers the plurality of pads 70.

A distance between two adjacent pads 70 is not limited, as long as the two adjacent pads 70 are not in contact.

Figure 13:
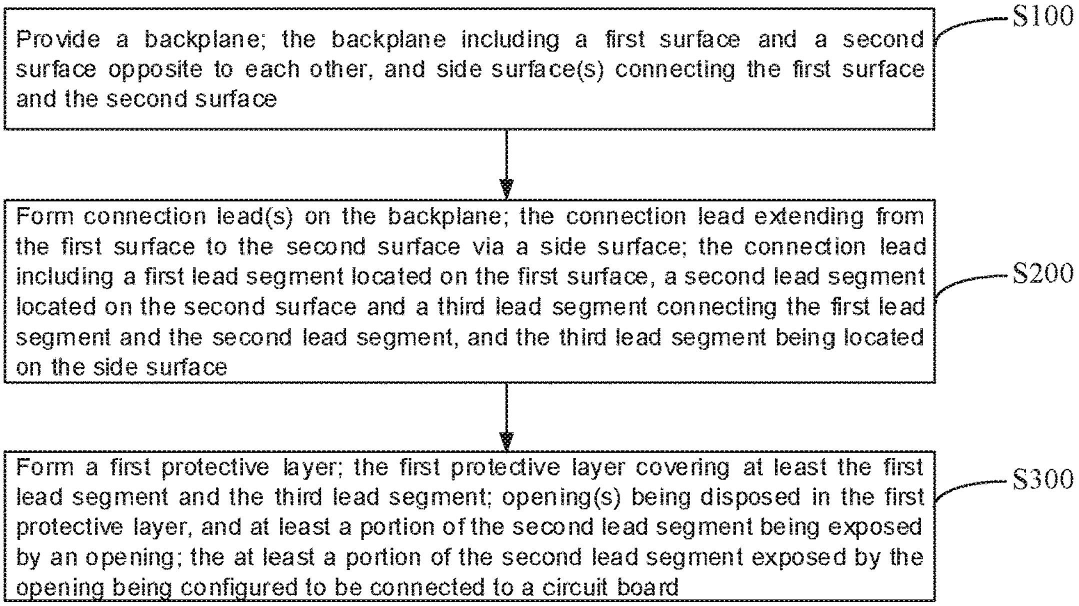
FIG. 13 is a flow diagram of a manufacturing method of a display panel, in accordance with some embodiments.

As shown in FIG. 13, some embodiments of the present disclosure further provide a manufacturing method of a display panel 300. The manufacturing method includes S100 to S300.

In S100, a backplane 10 is provided. The backplane 10 includes a first surface 11 and a second surface 12 opposite to each other, and side surface(s) 13 connecting the first surface 11 and the second surface 12.

Figure 14:
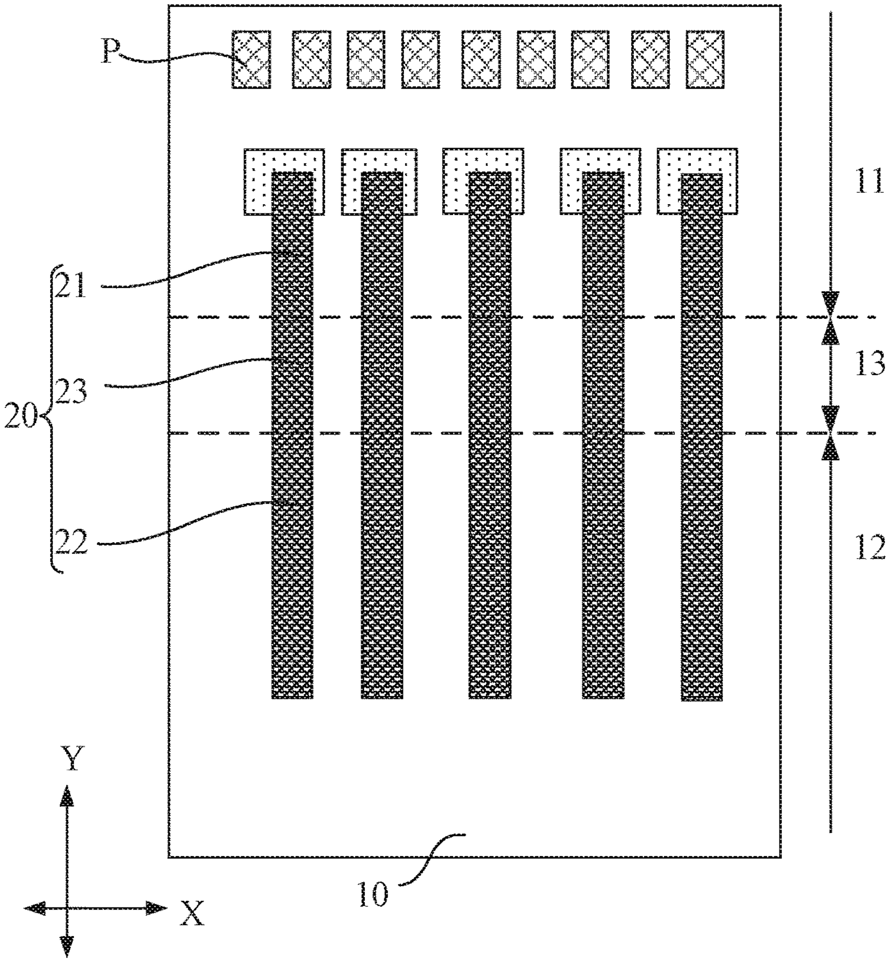
FIG. 14 is a state diagram in a manufacturing process of a display panel, in accordance with some embodiments.

In S200, as shown in FIG. 14, connection lead(s) 20 are formed on the backplane 10. The connection lead 20 extends from the first surface 11 to the second surface 12 via the side surface 13. The connection lead 20 includes a first lead segment 21 located on the first surface 11, a second lead segment 22 located on the second surface 12, and a third lead segment 23 connecting the first lead segment 21 and the second lead segment 22. The third lead segment 23 is located on the side surface 13.

For example, the connection lead 20 may have a single-layer structure or a multi-layer structure. In a case where the connection lead 20 has the single-layer structure, a material of the connection lead 20 may include metal such as copper. In a case where the connection lead 20 has the multi-layer structure, the connection lead 20 may have a metal stacked structure of titanium/aluminum/titanium, molybdenum/aluminum/molybdenum or titanium/copper/titanium. Alternatively, the connection lead may include a first buffer conductive material, a main material and a second buffer conductive material that are stacked in sequence. An adhesion between the first buffer conductive material and the backplane is greater than an adhesion between the main material and the backplane. An oxidation resistance of the second buffer conductive material is better than an oxidation resistance of the main material. The first buffer conductive material and the second buffer conductive material are the same, and include at least one of titanium, chromium, molybdenum and molybdenum-niobium alloy. The main material may be copper.

Figure 15:
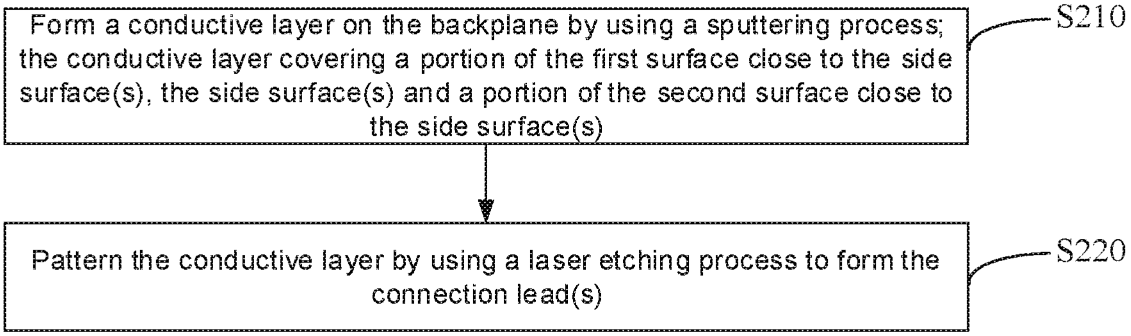
FIG. 15 is a flow diagram of another manufacturing method of a display panel, in accordance with some embodiments.

In some examples, as shown in FIG. 15, forming the connection lead(s) 20 on the backplane 10 in S200, may include S210 and S220.

In S210, a conductive layer is formed on the backplane 10 by using a sputtering process. The conductive layer covers a portion of the first surface 11 close to the side surface(s) 13, the side surface(s) 13 and a portion of the second surface 12 close to the side surface(s) 13.

In S220, the conductive layer is patterned by using a laser etching process to form the connection lead(s) 20.

Figure 16:
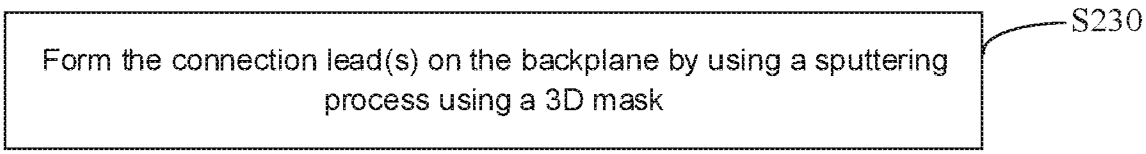
FIG. 16 is a flow diagram of yet another manufacturing method of a display panel, in accordance with some embodiments.

In some other examples, as shown in FIG. 16, forming the connection lead(s) 20 on the backplane 10 in S200, may include S230.

In S230, the connection lead(s) 20 are formed on the backplane 10 by using a sputtering process using a three-dimensional (3D) mask.

For example, the connection lead(s) 20 are formed on the backplane 10 in S200, which may be that a plurality of connection leads 20 are formed on the backplane 10 synchronously.

In S300, referring to FIGS. 5A, 5B, 5C, 8A and 8B, a first protective layer 30 is formed. The first protective layer 30 covers at least first lead segment(s) 21 and third lead segment(s) 23 of the connection lead(s) 20. Opening(s) 31 are provided in the first protective layer 30, and at least a portion of each of second lead segment(s) 22 of the connection lead(s) 20 is exposed by an opening 31. The at least a portion of the second lead segment 22 exposed by the opening 31 is configured to be connected to a circuit board 40.

In the display panel 300 obtained by using the manufacturig method of the display panel provided in some embodiments of the present disclosure, the second lead segment(s) 22 located on the second surface 12 are configured to be directly connected to the circuit board 40, so that circuit structure(s) are not required to be provided on the second surface 12, which effectively simplifies a structure and manufacturing process of the display panel 300, so as to reduce manufacturing costs of the display panel and improve a yield of the display panel 300. Moreover, except a portion of the connection lead 20 configured to be bonded to the circuit board 40 (i.e., the at least a portion of the second lead segment 22 exposed by the opening 31), the rest of the connection lead 20 is covered by the first protective layer 30, and is difficult to be eroded by water vapor and oxygen in the air, so that a yield of the connection lead 20 is effectively improved. Thus, the yield of the display panel 300 is effectively improved, and the service life of the display panel 300 is effectively prolonged.

Figure 17:
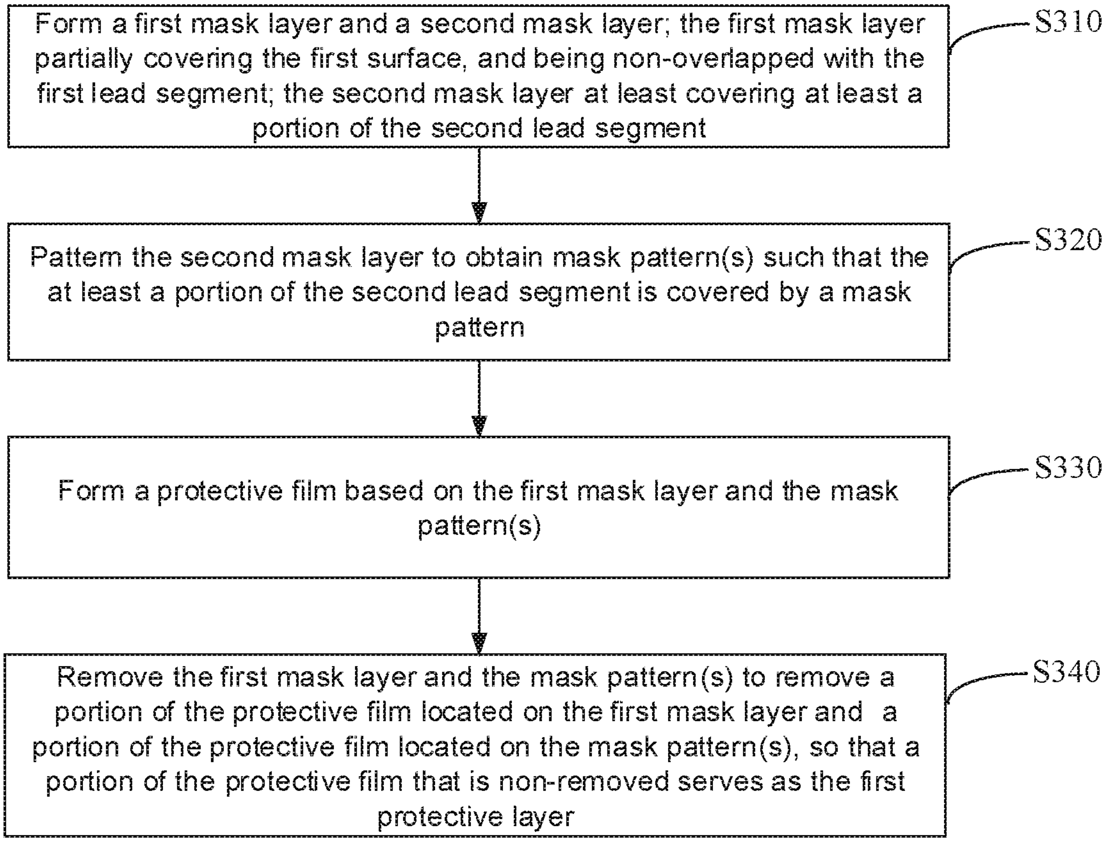
FIG. 17 is a flow diagram of yet another manufacturing method of a display panel, in accordance with some embodiments.

In some embodiments, as shown in FIG. 17, forming the first protective layer 30 in S300, includes S310 to S340.

Figure 18:
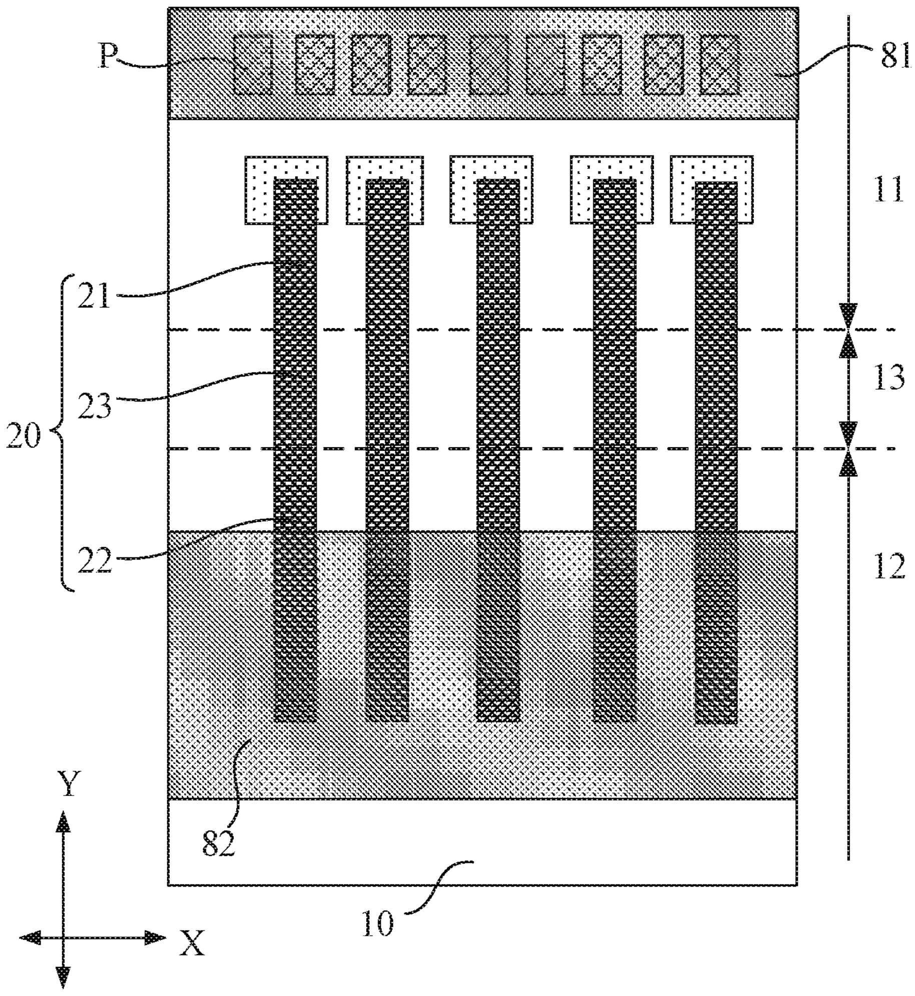
FIG. 18 is another state diagram in a manufacturing process of a display panel, in accordance with some embodiments.

In S310, as shown in FIG. 18, a first mask layer 81 and a second mask layer 82 are formed. The first mask layer 81 partially covers the first surface 11, and is non-overlapped with the first lead segment(s) 21. The second mask layer 82 at least covers the at least a portion of each of the second lead segment(s) 22.

In some examples, as shown in FIG. 18, the second mask layer 82 may cover only the portion of each of the second lead segment(s) 22.

In some other examples, the second mask layer 82 may cover the second lead segment(s) 22 entirely.

In yet other examples, the second mask layer 82 may cover the second lead segment(s) 22 and a portion of the second surface 12 that is non-covered by the second lead segment(s) 22.

In a case where the display panel 300 includes a plurality of connection leads 20, the second mask layer 82 covers at least a portion of each of second lead segments 22 of the plurality of connection leads 20.

In some examples, the first mask layer 81 may be made of the same material as the second mask layer 82. For example, the material for the first film layer 81 and the second mask layer 82 may be polyimide (PI).

In some other examples, the first mask layer 81 may be made of a different material from the second mask layer 82.

For example, the first mask layer 81 may cover a display area of the backplane 10. In this way, when the first mask layer 81 is removed to remove a portion of a protective film 90 located on the first mask layer 81, so as to obtain the first protective layer 30, the first protective layer 30 may not cover the display area AA, so that after the first protective layer 30 is manufactured, electronic components (e.g., micro light-emitting diodes, sensors and micro drivers) may be provided at respective positions of the backplane 10.

Figure 19A:
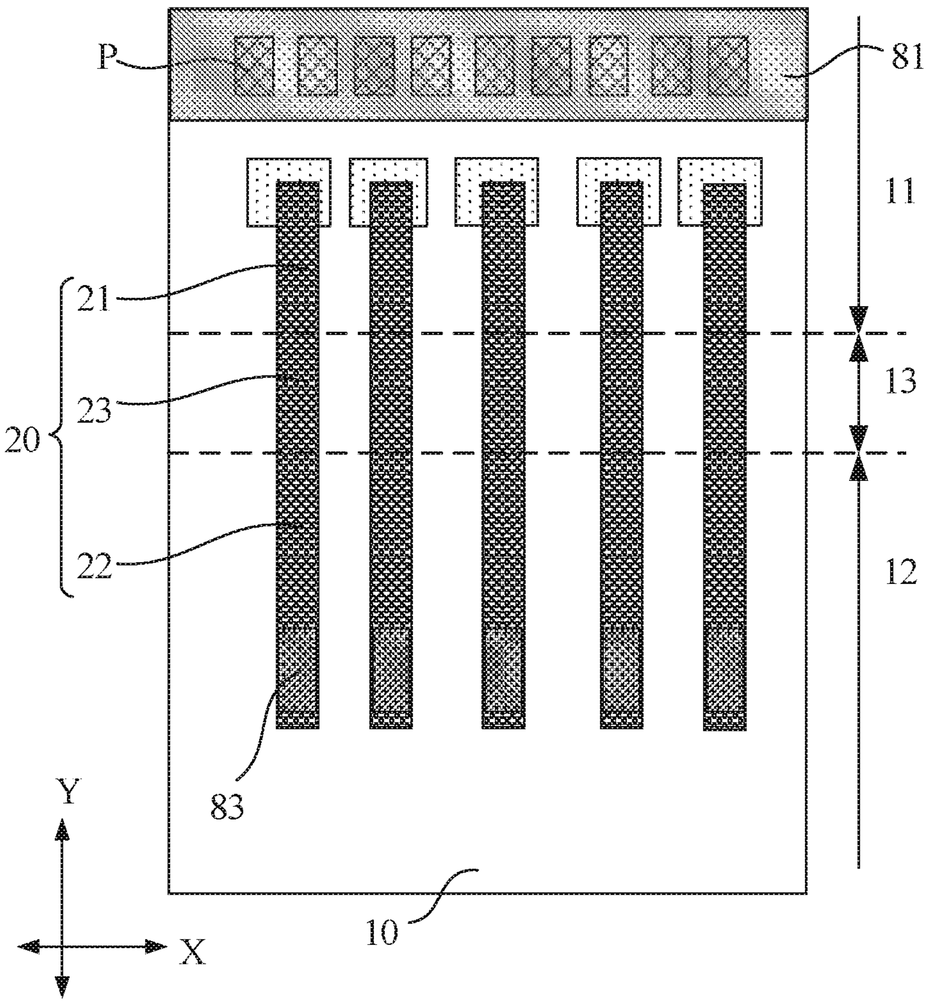
FIG. 19A is yet another state diagram in a manufacturing process of a display panel, in accordance with some embodiments.
Figure 19B:
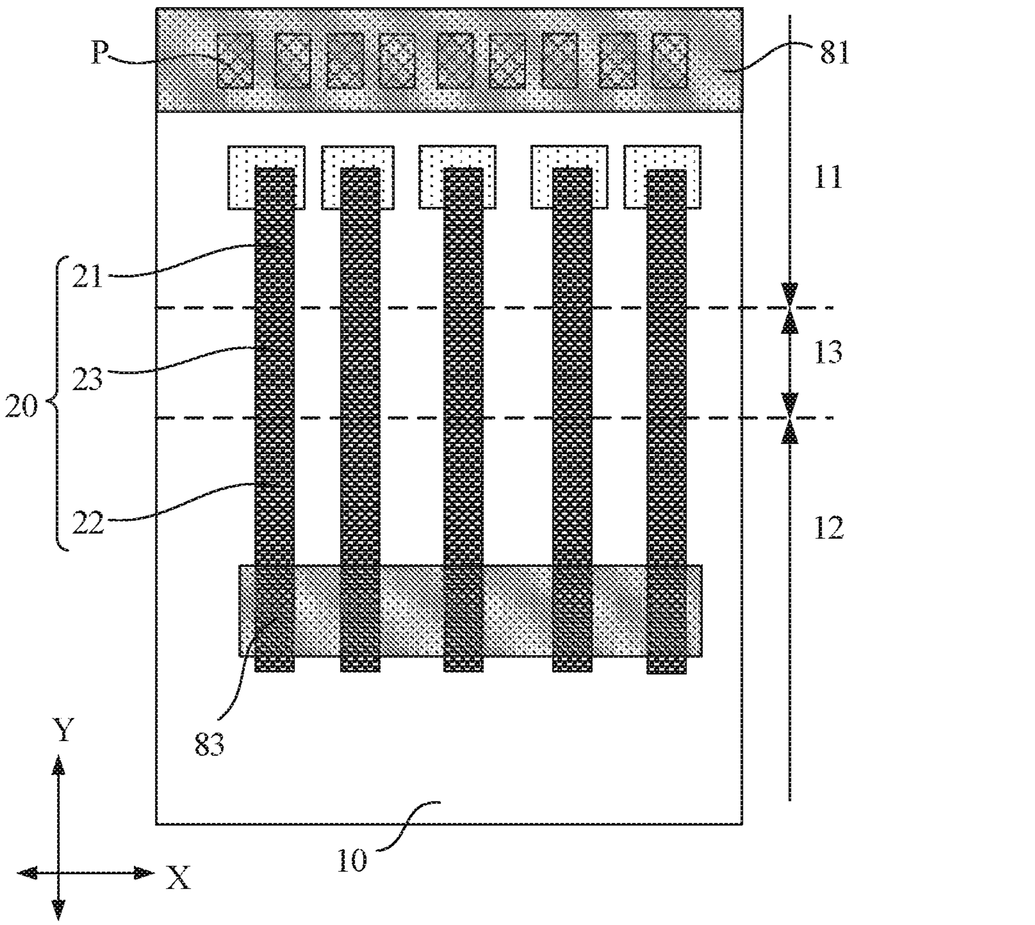
FIG. 19B is yet another state diagram in a manufacturing process of a display panel, in accordance with some embodiments.

In S320, as shown in FIGS. 19A and 19B, the second mask layer 82 is patterned to obtain mask pattern(s) 83 such that the at least a portion of the second lead segment 22 is covered by the mask pattern 83.

The mask pattern(s) 83 are formed on the second lead segment(s) 22, so that at least a portion of the protective film 90 formed in a subsequent step may not be in direct contact with the second lead segment(s) 22, and thus, the at least a portion of the protective film 90 is capable of being easily removed to form the opening(s).

In some embodiments, as shown in FIG. 19A, in the case where the display panel 300 includes the plurality of connection leads 20, the second mask layer 82 may be patterned to obtain a plurality of mask patterns 83. The mask pattern 83 covers at least a portion of the second lead segment 22 of the connection lead 20.

In some other embodiments, as shown in FIG. 19B, in the case where the display panel 300 includes the plurality of connection leads 20, the second mask layer 82 may be patterned to obtain at least one mask pattern 83. The mask pattern 83 covers at least a portion of each of second lead segments 22 of connection leads 20.

Figure 20:
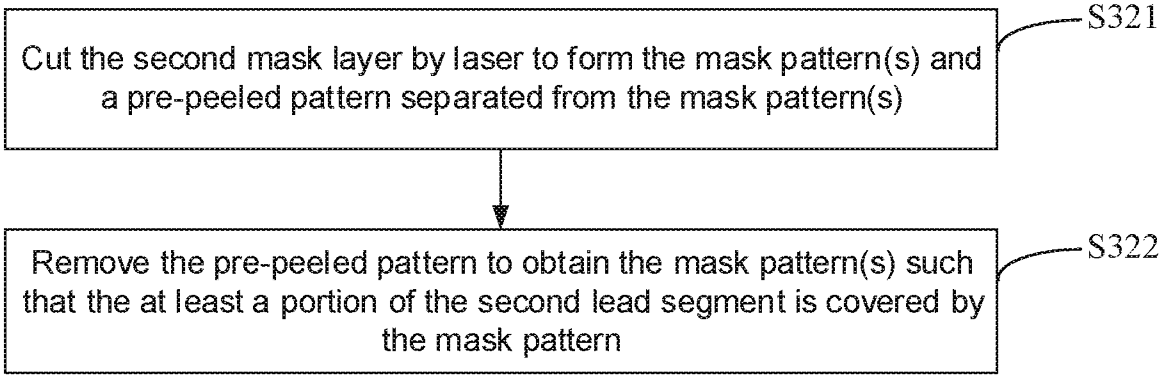
FIG. 20 is a flow diagram of yet another manufacturing method of a display panel, in accordance with some embodiments.

In some examples, as shown in FIG. 20, patterning the second mask layer 82 to obtain the mask pattern(s) 83 such that the at least a portion of the second lead segment 22 is covered by the mask pattern 83 in S320, includes S321 and S322.

Figure 21A:
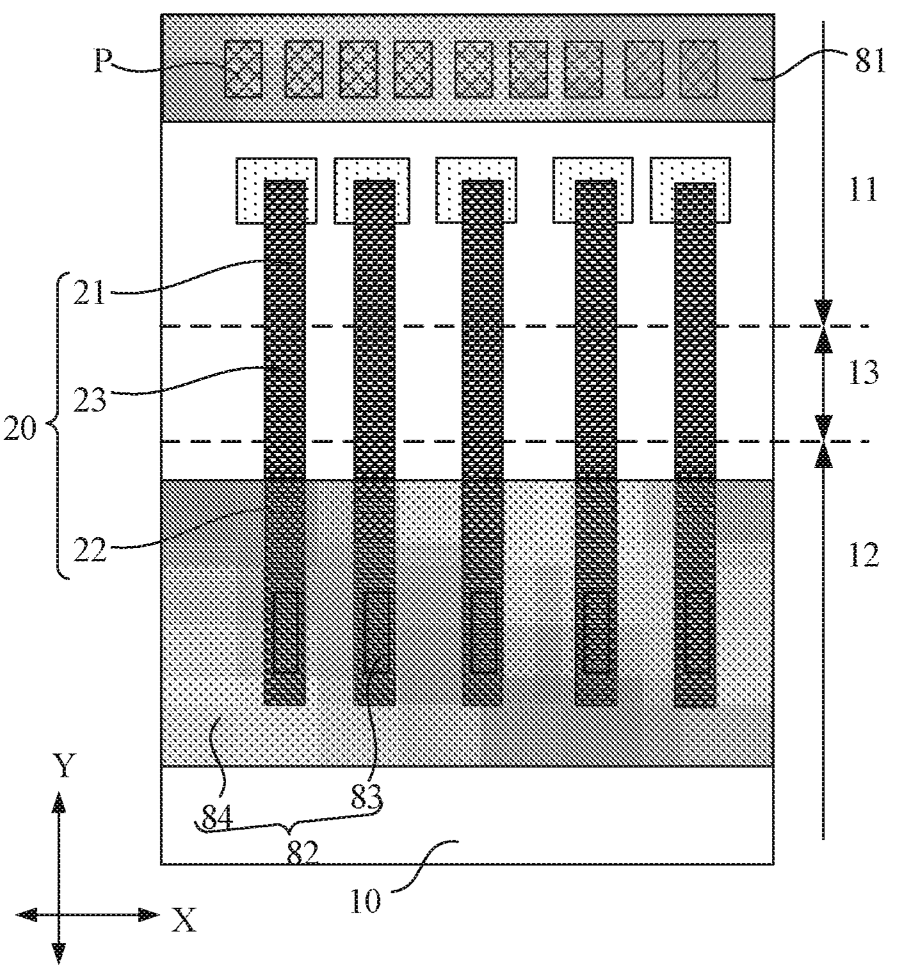
FIG. 21A is yet another state diagram in a manufacturing process of a display panel, in accordance with some embodiments.
Figure 21B:
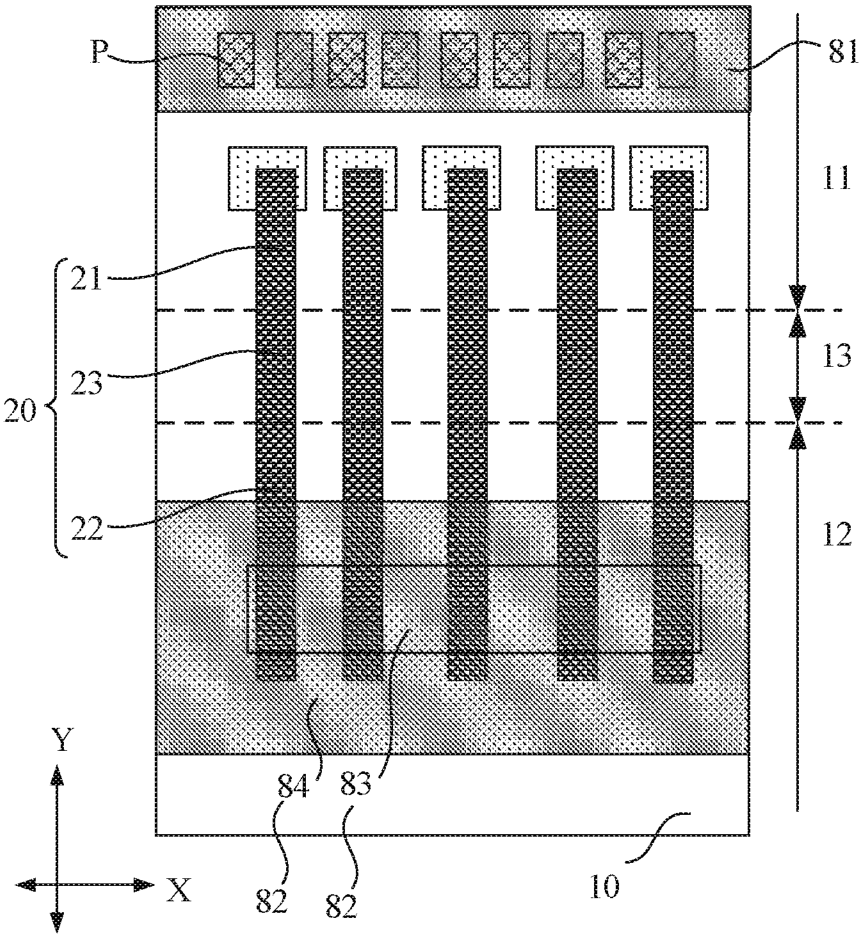
FIG. 21B is yet another state diagram in a manufacturing process of a display panel, in accordance with some embodiments.

In S321, as shown in FIGS. 21A and 21B, the second mask layer 82 is cut by laser to form the mask pattern(s) 83 and a pre-peeled pattern 84 separated from the mask pattern (s) 83.

In S322, referring to FIGS. 19A and 19B, the pre-peeled pattern 84 is removed to obtain the mask pattern(s) 83 such that the at least a portion of the second lead segment 22 is covered by the mask pattern 83.

Figure 22A:
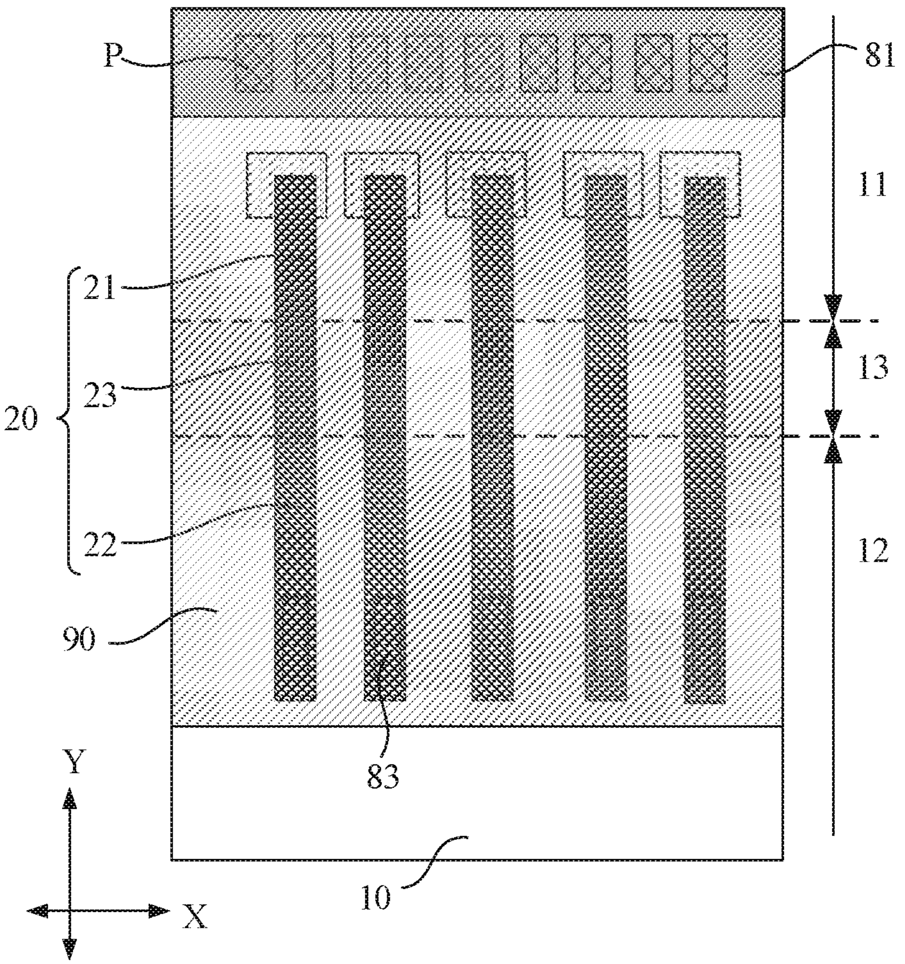
FIG. 22A is yet another state diagram in a manufacturing process of a display panel, in accordance with some embodiments.
Figure 22B:
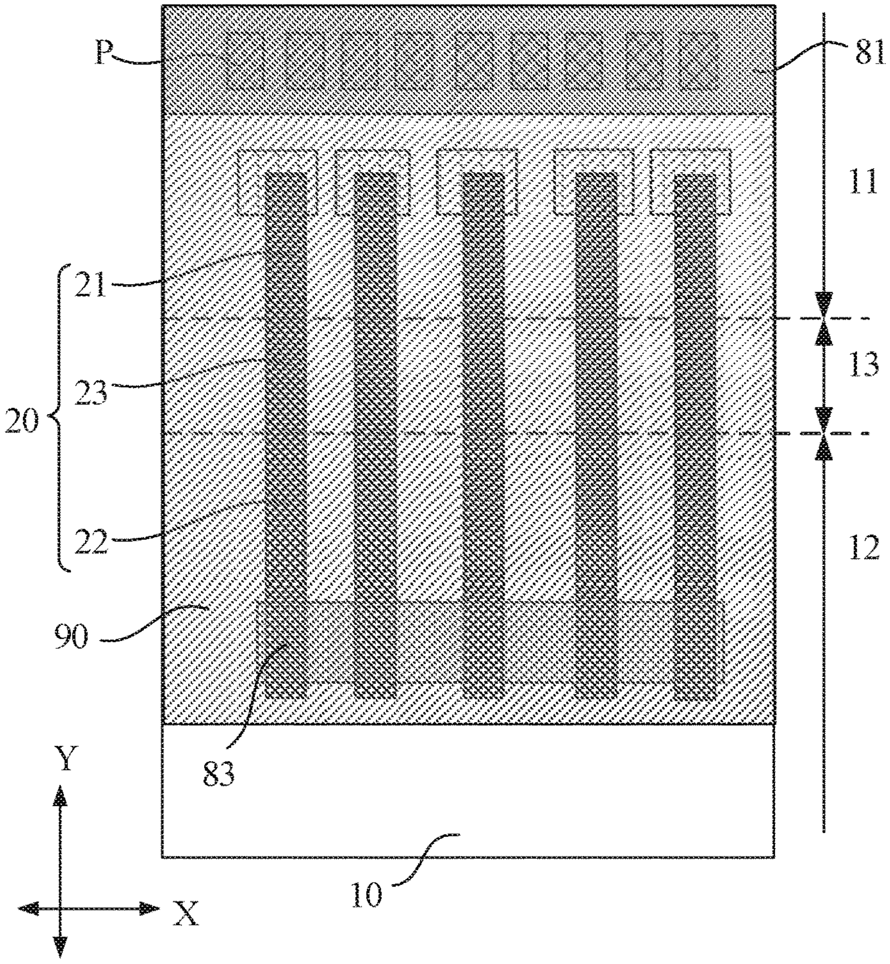
FIG. 22B is yet another state diagram in a manufacturing process of a display panel, in accordance with some embodiments.

In S330, as shown in FIGS. 22A and 22B, the protective film 90 is formed based on the first mask layer 81 and the mask pattern(s) 83.

For example, the protective film 90 may be formed by using a sputtering process, so that the protective film 90 is thin, and has a uniform thickness at different positions.

For example, the protective film 90 may be made of a material with a high hydrophobicity. For example, the material of the first protective layer 30 may include silicon nitride.

In S340, as shown in FIGS. 8A and 8B, the first mask layer 81 and the mask pattern(s) 83 are removed to remove the portion of the protective film 90 located on the first mask layer 81 and a portion of the protective film 90 located on the mask pattern(s) 83, so that a portion of the protective film 90 that is not removed serves as the first protective layer 30.

In some examples, the first mask layer 81 has at least one surface with a viscosity through which the first mask layer 81 is adhered to the first surface 11. The mask pattern(s) 83 (or the second mask layer 82) have at least one surface with a viscosity through which the mask pattern(s) 83 (or the second mask layer 82) are adhered to the second surface 12 and the second lead segment(s) 22.

Figure 23:
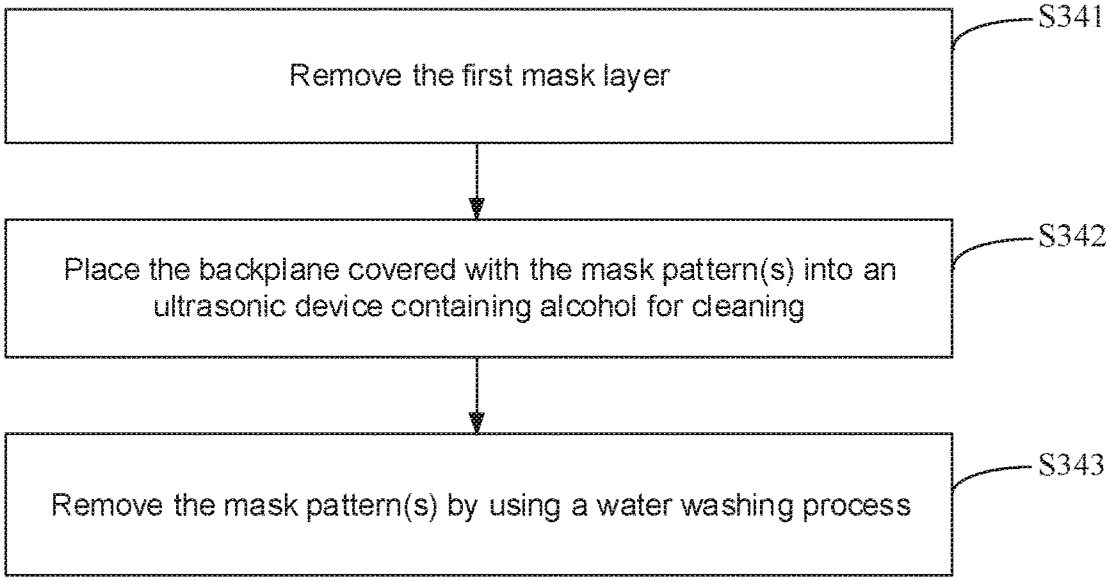
FIG. 23 is a flow diagram of yet another manufacturing method of a display panel, in accordance with some embodiments.

Based on this, as shown in FIG. 23, removing the first mask layer 81 and the mask pattern(s) 83 in S340, includes S341 to S343.

In S341, the first mask layer 81 is removed.

For example, due to a large area of the first mask layer 81 and a small viscosity between an adhesive layer of the first mask layer 81 and the first surface 11, the first mask layer 81 may be removed by a manual or mechanical removal.

In S342, the backplane 10 covered with the mask pattern(s) 83 is placed into an ultrasonic device containing alcohol for cleaning.

For example, the backplane 10 may be placed vertically into the ultrasonic device, and the alcohol is over the mask pattern(s) 83. The alcohol solution may penetrate the protective film 90 to dissolve a surface material in contact with a viscous material on the surface(s) of the mask pattern 83, so that the mask pattern(s) 83 are separated from the second lead segment(s) 22. Here, the phrase "separated from" may mean that the mask pattern(s) 83 may be in physical contact with the second lead segment(s) 22, but the mask pattern(s) 83 are not adhered to the second lead segment(s) 22.

In S343, the mask pattern(s) 83 are removed by using a water washing process. For example, the mask pattern(s) 83 may be removed by using an air knife in the water washing process.

In some other examples, after the backplane 10 covered with the mask pattern(s) 83 is placed into the ultrasonic device containing alcohol for cleaning, the mask pattern(s) 83 may be directly blown off by using an air gun, and the backplane 10 is dried.

It will be noted that although the mask pattern(s) 83 are covered with the protective film 90 before the water washing process (or the air gun removing means) is performed, a coverage of the mask pattern 83 by the protective film 90 is general due to a fact that the thickness of the protective film 90 (for example, the thickness of the protective film 90 is in the order of nanometers) is much smaller than the thickness of the mask pattern 83 (for example, the thickness of the mask pattern 83 is in the order of micrometers). Moreover, due to the existence of the second lead segment 22 and the mask pattern 83, a portion of the protective film 90 located on a side of the mask pattern 83 away from the second surface 12 and a portion of the protective film 90 not in contact with the mask pattern 83 have a level difference therebetween. That is, the protective film 90 has some cracks at the level difference inevitably, and the cracks are diffused by the air knife or the air gun, so that the mask pattern 83 and the corresponding portion of the protective film 90 covering the mask pattern 83 are able to be removed together.

In yet other examples, the first mask layer 81 and the mask pattern(s) 83 may be removed by using an adhesive tape. For example, the adhesive tape may be attached to the backplane 10, and covers at least the first mask layer 81 and the mask pattern(s) 83. A viscosity of the adhesive tape may be greater than the viscosity of the mask pattern 83, and is less than a viscosity of the protective film 90. In this way, in a process of removing the adhesive tape, the first mask layer 81 is subjected to a force to be seperated from the first surface 11 of the backplane 10, and the mask pattern(s) 83 are subjected to a force to be seperated from the second lead segment(s) 22, so that the first mask layer 81 and the mask pattern(s) 83 are removed together with the adhesive tape. The adhesive tape may be removed manually or mechanically.

In some embodiments, since in the process of forming the protective film 90, the material of the protective film 90 partially penetrates between the mask pattern(s) 83 and the second lead segment(s) 22, referring to FIGS. 8A, 8B, 19A and 19B, an area of an orthogonal projection of the opening 31 of the first protective layer 30 on the second surface 12 is less than an area of an orthographic projection of the mask pattern 83 on the second surface 12.

For example, in a case where the orthographic projection of the mask pattern 83 on the second surface 12 is substantially in a rectangular shape, and the orthogonal projection of the opening 31 on the second surface 12 is also substantially in a rectangular shape, a dimension of the orthogonal projection of the opening 31 on the second surface 12 in the horizontal direction X is less than a dimension of the orthographic projection of the mask pattern 83 on the second surface 12 in the horizontal direction X; and/or a dimension of the orthogonal projection of the opening 31 on the second surface 12 in the vertical direction Y is less than a dimension of the orthographic projection of the mask pattern 83 on the second surface 12 in the vertical direction Y.

Figure 24:
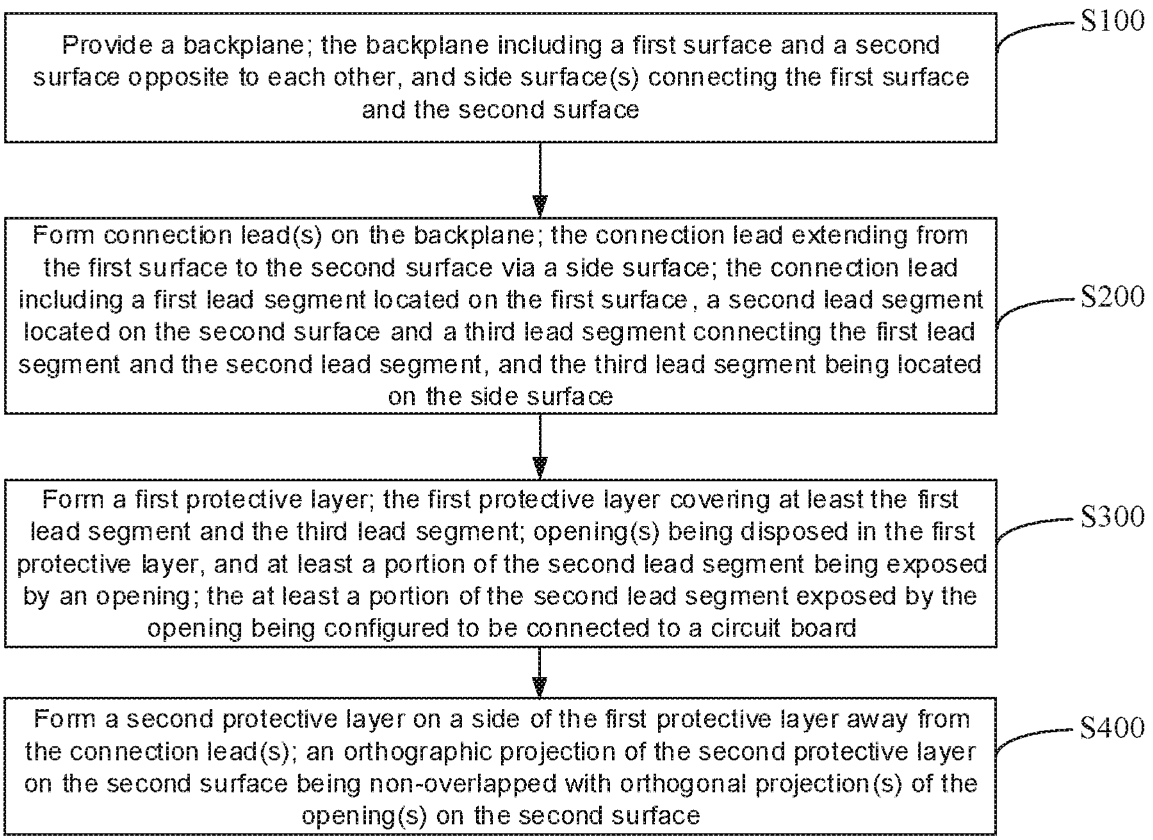
FIG. 24 is a flow diagram of yet another manufacturing method of a display panel, in accordance with some embodiments.

In some embodiments, as shown in FIG. 24, the manufacturing method further includes S400.

In S400, a second protective layer 50 is formed on a side of the first protective layer 30 away from the connection lead(s) 20. An orthographic projection of the second protective layer 50 on the second surface 12 is non-overlapped with the orthogonal projection(s) of the opening(s) 31 on the second surface 12.

For example, the second protective layer 50 may be formed by a pad printing process.

Figure 25:
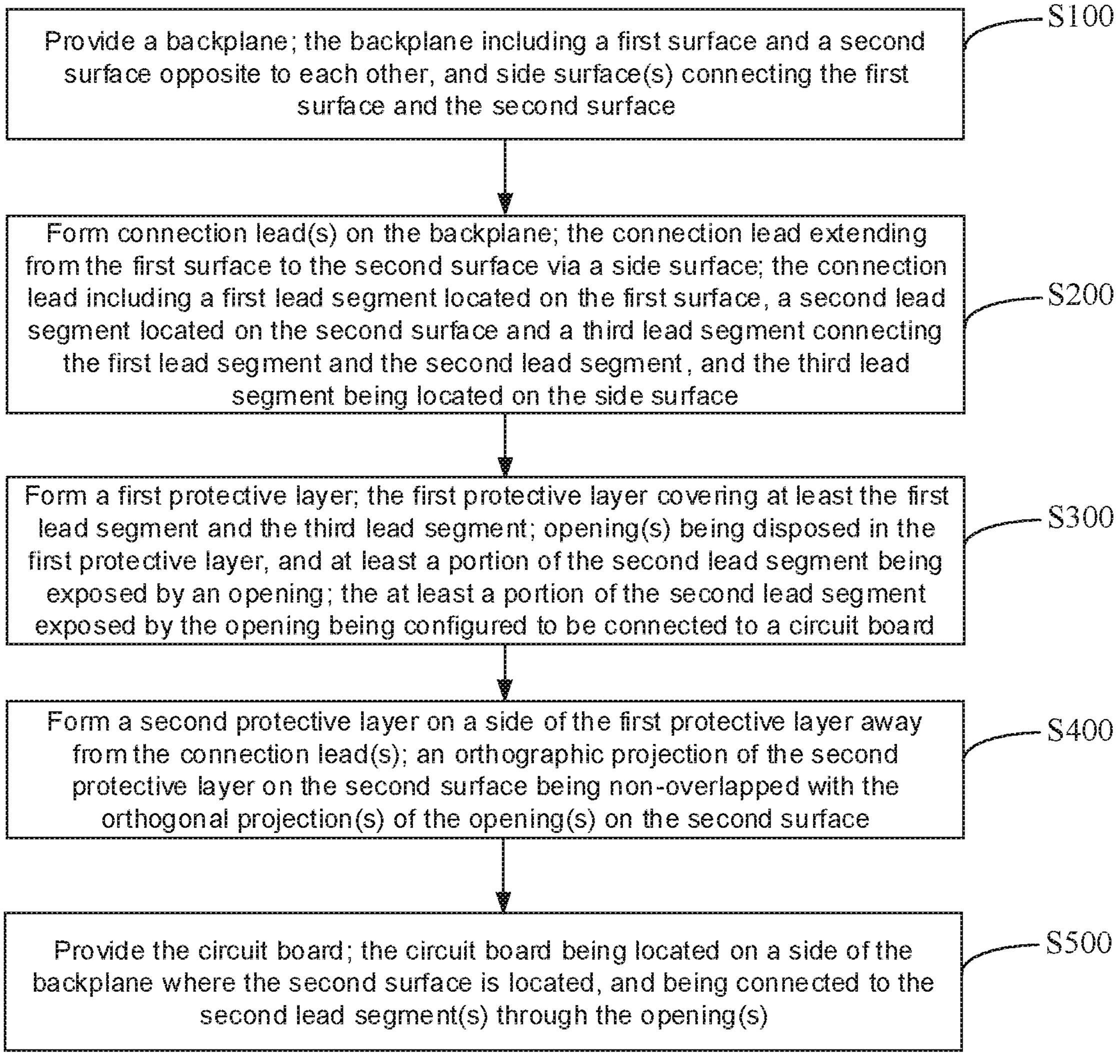
FIG. 25 is a flow diagram of yet another manufacturing method of a display panel, in accordance with some embodiments.

In some embodiments, as shown in FIG. 25, the manufacturing method further includes S500.

In S500, the circuit board 40 is provided. The circuit board 40 is located on a side of the backplane 10 where the second surface 12 is located, and is connected to the second lead segment(s) 22 through the opening(s) 31.

Figure 26:
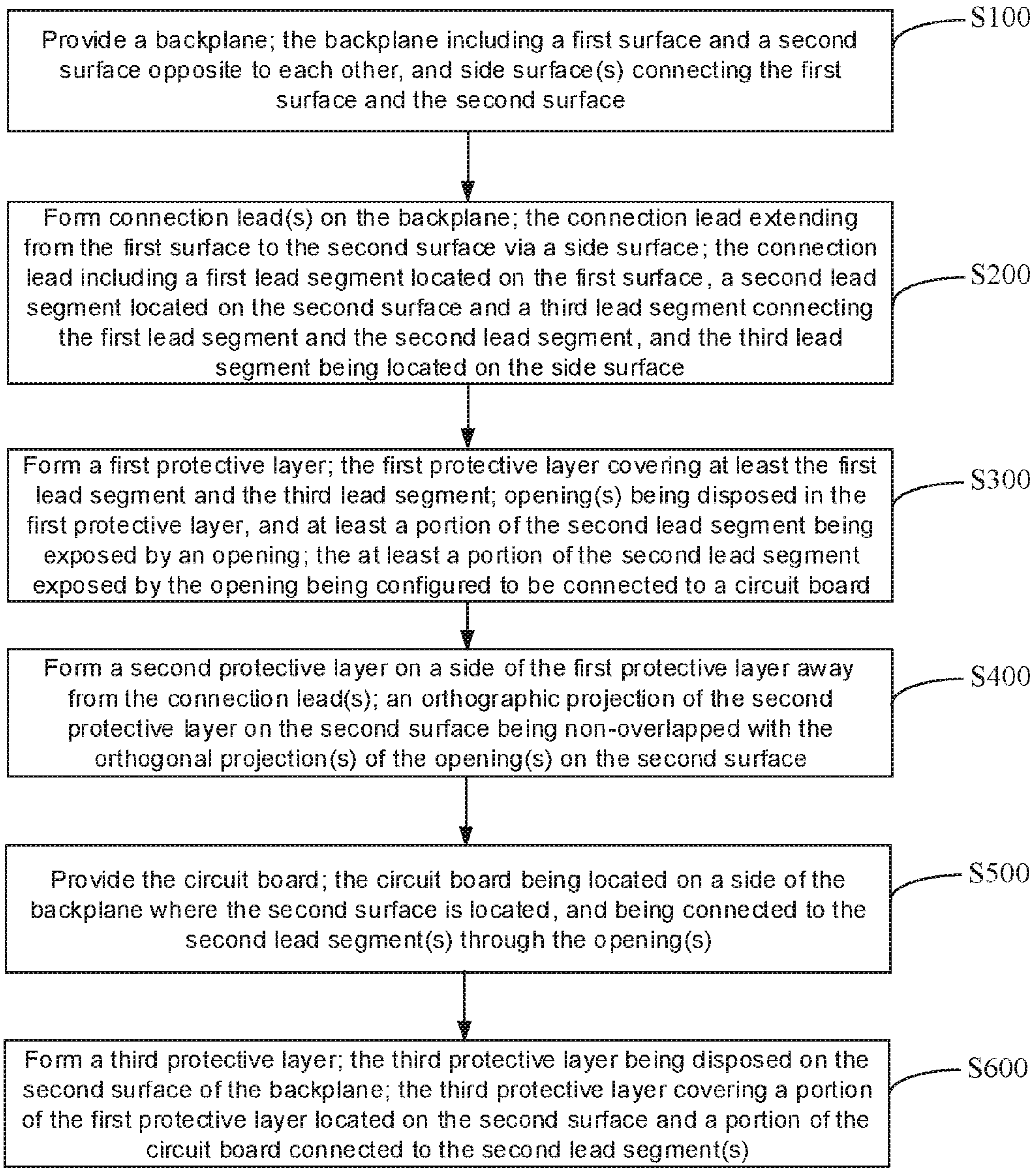
FIG. 26 is a flow diagram of yet another manufacturing method of a display panel, in accordance with some embodiments.

In some embodiments, as shown in FIG. 26, the manufacturing method further includes S600.

In S600, a third protective layer 60 is formed. The third protective layer 60 is disposed on the second surface 12 of the backplane 10. The third protective layer 60 covers a portion of the first protective layer 30 located on the second surface 12 and a portion of the circuit board 40 connected to the second lead segment(s) 22.

For example, the third protective layer 60 may be formed by coating.

Figure 27:
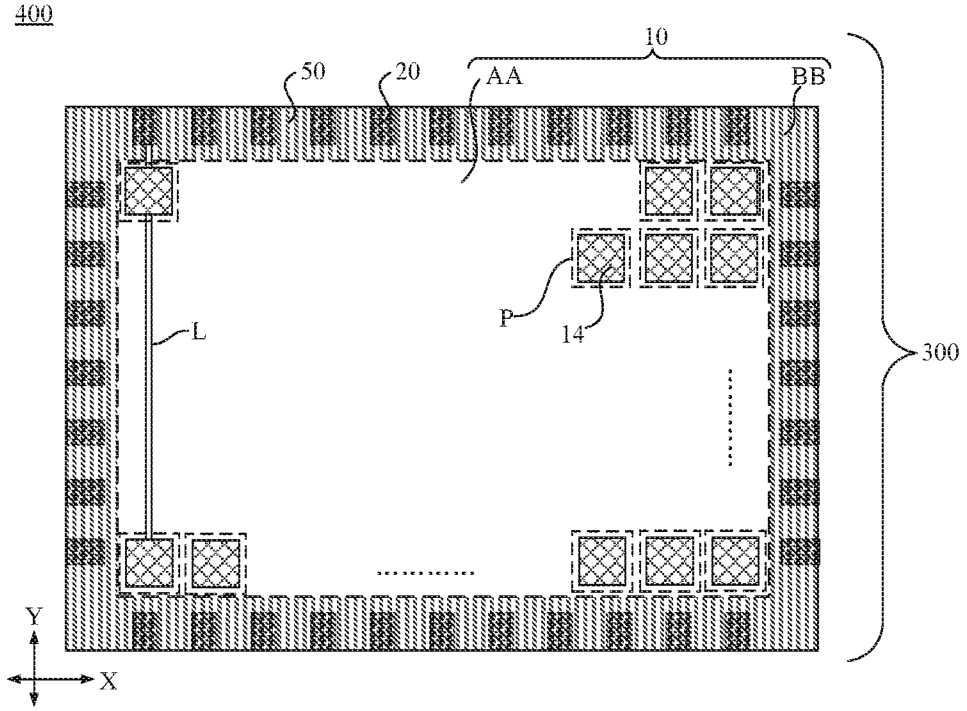
FIG. 27 is a structural diagram of a display device, in accordance with some embodiments.

Some embodiments of the present disclosure further provide a display device 400, as shown in FIG. 27. The display device 400 includes the display panel 300 in any one of the above embodiments.

For example, the display device 400 may be a mini light-emitting diode (Mini LED) display device or a micro light-emitting diode (Micro LED) display device.

In some embodiments, the display device 400 may further include a housing, and the display panel 300 is located inside the housing. The housing is configured to protect the display panel 300. In some other embodiments, the display panel 400 may further include a mainboard, and the mainboard may be connected to the circuit board to control the display panel. Alternatively, the mainboard may be directly connected to the display panel to control the display panel. In yet another embodiments, the display device 400 may further include a frame.

Beneficial effects that can be achieved by the display device 400 provided in some embodiments of the present disclosure are the same as the beneficial effects that can be achieved by the display panel 300 provided in any one of the above embodiments, and will not be repeated here.

Figure 28:
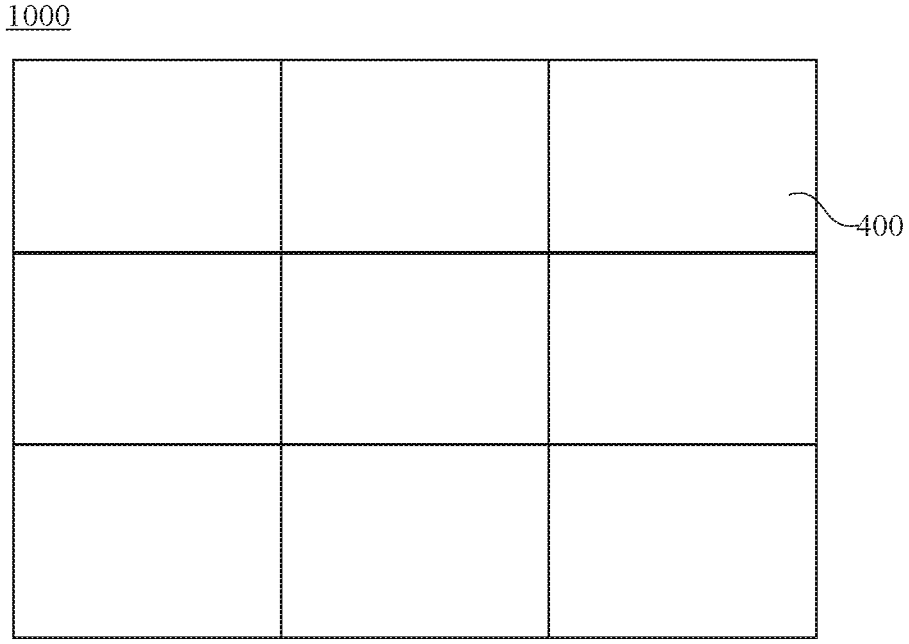
FIG. 28 is a structural diagram of a splicing display device, in accordance with some embodiments.

As shown in FIG. 28, some embodiments of the present disclosure further provide a splicing display device 1000. The splicing display device 1000 includes a plurality of display devices 400 provided in the above embodiments, and the plurality of display devices 400 are spliced and assembled.

The splicing display device 1000 display a large image. For example, the splicing display device 1000 may be used as an advertisement splicing screen or a conference splicing screen.

The number of display devices 400 in the splicing display device 1000 is not limited. FIG. 27 exemplarily illustrates the splicing display device 1000 including nine display devices 400.

The above descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a backplane including a first surface and a second surface opposite to each other and at least one side surface connecting the first surface and the second surface;

at least one connection lead disposed on the backplane and each extending from the first surface to the second surface via a side surface in the at least one side surface; wherein the connection lead includes a first lead segment located on the first surface, a second lead segment located on the second surface and in contact with the second surface, and a third lead segment connecting the first lead segment and the second lead segment, and the third lead segment is located on the side surface; and a first protective layer covering at least the first lead segment and the third lead segment; wherein at least one opening is disposed in the first protective layer, and at least a portion of the second lead segment is exposed by an opening in the at least one opening; the at least a portion of the second lead segment exposed by the opening is configured to be connected to a circuit board.

2. The display panel according to claim 1, wherein an orthogonal projection of the opening on the second surface is located within an orthographic projection of the second lead segment on the second surface, and in a first direction, each of two borders of the opening and a respective one of two borders of a portion of the second lead segment corresponding to the opening have a distance therebetween; the first direction is parallel to a boundary line of the side surface and the second surface.

3. The display panel according to claim 1, wherein the at least one connection lead includes a plurality of connection leads, and second lead segments of at least two connection leads located at a same side surface are arranged at intervals in a first direction; the first direction is parallel to a boundary line of the same side surface and the second surface; and the at least one opening includes a plurality of openings, and at least two openings, respectively corresponding to the at least two second lead segments of the connection leads located at the same side surface, are arranged at intervals in the first direction; an opening in the at least two openings exposes at least a portion of a second lead segment of a connection lead in the at least two connection leads.

4. The display panel according to claim 1, wherein the first protective layer further covers a portion of the second lead segment close to the third lead segment.

5. The display panel according to claim 4, wherein the second lead segment includes a first sub-segment, a second sub-segment and a third sub-segment connected in sequence; the first sub-segment is connected to the third lead segment; an extending direction of the second sub-segment and an extending direction of the first sub-segment intersect, and an extending direction of the third sub-segment is substantially same as the extending direction of the first sub-segment; and the first protective layer further covers the first sub-segment and the second sub-segment, and the third sub-segment is exposed by the opening.

6. The display panel according to claim 5, wherein the at least one connection lead includes a plurality of connection leads, and in a direction from the first sub-segment to the third sub-segment, second sub-segments of at least two connection leads located at a same side surface get closer to each other.

7. The display panel according to claim 4, wherein the second lead segment includes a fourth sub-segment and a fifth sub-segment connected in sequence; the fourth sub-segment is connected to the third lead segment, and the fourth sub-segment and the fifth sub-segment are located on a same straight line; and the first protective layer further covers the fourth sub-segment, and the fifth sub-segment is exposed by the opening.

8. The display panel according to claim 1, wherein the backplane has a display area and a non-display area located on at least one side of the display area; the first lead segment is located in the non-display area, and the first protective layer further covers regions respectively located at two sides of the connection lead in a first direction; the first direction is parallel to a boundary line of the side surface and the second surface; and the display area is non-covered by the first protective layer.

9. The display panel according to claim 1, further comprising:

a second protective layer located on a side of the first protective layer away from the connection lead; wherein an orthographic projection of the second protective layer on the second surface is non-overlapped with at least one orthogonal projection of the at least one opening on the second surface.

10. The display panel according to claim 9, wherein the second protective layer has a border located on the second surface, and the opening is located on a side of the border away from the side surface.

11. The display panel according to claim 1, further comprising:

the circuit board located on a side of the backplane where the second surface is located and connected to the second lead segment through the opening.

12. The display panel according to claim 11, further comprising:

a third protective layer disposed on the second surface of the backplane; wherein the third protective layer covers a portion of the first protective layer located on the second surface and a portion of the circuit board connected to the second lead segment.

13. The display panel according to claim 1, further comprising:

a pad located on the first surface; wherein the pad is electrically connected to the first lead segment of the connection lead, and the first protective layer further covers the pad.

14. The display panel according to claim 1, wherein a material of the first protective layer includes silicon nitride.

15. A manufacturing method of a display panel, comprising:

providing a backplane; wherein the backplane includes a first surface and a second surface opposite to each other, and at least one side surface connecting the first surface and the second surface;

forming at least one connection lead on the backplane; wherein the connection lead extends from the first surface to the second surface via a side surface in the at least one side surface; the connection lead includes a first lead segment located on the first surface, a second lead segment located on the second surface and in contact with the second surface, and a third lead segment connecting the first lead segment and the second lead segment, and the third lead segment is located on the side surface; and forming a first protective layer; wherein the first protective layer covers at least the first lead segment and the third lead segment; at least one opening is disposed in the first protective layer, and at least a portion of the second lead segment is exposed by an opening in the at least one opening; the at least a portion of the second lead segment exposed by the opening is configured to be connected to a circuit board.

16. The manufacturing method according to claim 15, wherein forming the first protective layer, includes:

forming a first mask layer and a second mask layer; wherein the first mask layer partially covers the first surface, and is non-overlapped with the first lead segment; the second mask layer at least covers at least a portion of the second lead segment;

patterning the second mask layer to obtain at least one mask pattern such that the at least a portion of the second lead segment is covered by a mask pattern in the at least one mask pattern;

forming a protective film based on the first mask layer and the at least one mask pattern; and removing the first mask layer and the at least one mask pattern to remove a portion of the protective film located on the first mask layer and a portion of the protective film located on the at least one mask pattern, so that a portion of the protective film that is non-removed serves as the first protective layer.

17. The manufacturing method according to claim 16, wherein patterning the second mask layer to obtain the at least one mask pattern such that the at least a portion of the second lead segment is covered by the mask pattern, includes:

cutting the second mask layer by laser to form the at least one mask pattern and a pre-peeled pattern separated from the at least one mask pattern; and removing the pre-peeled pattern to obtain the at least one mask pattern such that the at least a portion of the second lead segment is covered by the mask pattern.

18. The manufacturing method according to claim 16, wherein removing the first mask layer and the at least one mask pattern, includes:

removing the first mask layer;

placing the backplane covered with the at least one mask pattern into an ultrasonic device containing alcohol for cleaning; and removing the at least one mask pattern by using a water washing process.

19. A display device, comprising:

the display panel according to claim 1.

20. A splicing display device, comprising:

a plurality of display devices according to claim 19 that are spliced and assembled.

* * * * *